(12) United States Patent
Chou et al.

(10) Patent No.: US 11,973,027 B2
(45) Date of Patent: Apr. 30, 2024

(54) SEMICONDUCTOR DEVICE AND METHODS OF FORMING THE SAME

(71) Applicant: Taiwan Semiconductor Manufacturing Company, Ltd., Hsinchu (TW)

(72) Inventors: Pei-Yu Chou, Hsinchu County (TW); Jr-Hung Li, Hsinchu County (TW); Liang-Yin Chen, Hsinchu (TW); Su-Hao Liu, Chiayi County (TW); Tze-Liang Lee, Hsinchu (TW); Meng-Han Chou, Hsinchu (TW); Kuo-Ju Chen, Taichung (TW); Huicheng Chang, Tainan (TW); Tsai-Jung Ho, Changhua County (TW); Tzu-Yang Ho, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/701,702

(22) Filed: Mar. 23, 2022

(65) Prior Publication Data
US 2022/0216147 A1    Jul. 7, 2022

Related U.S. Application Data

(63) Continuation of application No. 16/805,834, filed on Mar. 2, 2020, now Pat. No. 11,289,417.
(Continued)

(51) Int. Cl.
*H01L 23/522*    (2006.01)
*H01L 21/02*    (2006.01)
(Continued)

(52) U.S. Cl.
CPC .... *H01L 23/5226* (2013.01); *H01L 21/02636* (2013.01); *H01L 21/31053* (2013.01);
(Continued)

(58) Field of Classification Search
CPC ........... H01L 23/5226; H01L 21/02636; H01L 21/31053; H01L 21/76802;
(Continued)

(56) References Cited

U.S. PATENT DOCUMENTS 8,772,109 B2   7/2014 Colinge
8,785,285 B2   7/2014 Tsai et al.
(Continued)

*Primary Examiner* — Patricia D Valenzuela
(74) *Attorney, Agent, or Firm* — JCIPRNET

(57) ABSTRACT

A semiconductor device and a method of forming the same are provided. The semiconductor device includes a substrate, a gate structure, a dielectric structure and a contact structure. The substrate has source/drain (S/D) regions. The gate structure is on the substrate and between the S/D regions. The dielectric structure covers the gate structure. The contact structure penetrates through the dielectric structure to connect to the S/D region. A lower portion of a sidewall of the contact structure is spaced apart from the dielectric structure by an air gap therebetween, while an upper portion of the sidewall of the contact structure is in contact with the dielectric structure.

14 Claims, 33 Drawing Sheets

Related U.S. Application Data

(60) Provisional application No. 62/907,721, filed on Sep. 30, 2019.

(51) Int. Cl.
| | |
|---|---|
| *H01L 21/3105* | (2006.01) |
| *H01L 21/768* | (2006.01) |
| *H01L 23/532* | (2006.01) |
| *H01L 29/08* | (2006.01) |
| *H01L 29/66* | (2006.01) |
| *H01L 29/78* | (2006.01) |
| *H01L 23/528* | (2006.01) |
| *H01L 29/06* | (2006.01) |

(52) U.S. Cl.
CPC .. *H01L 21/76802* (2013.01); *H01L 21/76819* (2013.01); *H01L 21/7682* (2013.01); *H01L 21/76843* (2013.01); *H01L 21/76877* (2013.01); *H01L 23/5329* (2013.01); *H01L 29/0847* (2013.01); *H01L 29/6656* (2013.01); *H01L 29/66795* (2013.01); *H01L 29/7848* (2013.01); *H01L 29/7851* (2013.01); *H01L 23/5283* (2013.01); *H01L 29/0649* (2013.01); *H01L 29/66545* (2013.01); *H01L 29/785* (2013.01)

(58) Field of Classification Search
CPC ........... H01L 21/76819; H01L 21/7682; H01L 21/76843; H01L 21/76877; H01L 23/5329; H01L 29/0847; H01L 29/6656; H01L 29/66795; H01L 29/7848; H01L 29/7851; H01L 23/5283; H01L 29/0649; H01L 21/76831; H01L 21/76895; H01L 23/485; H01L 21/3115; H01L 29/41791; H01L 29/4991; H01L 29/6653; H01L 29/165; H01L 2221/1063; H01L 29/66545; H01L 29/785

See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 11,289,417 B2 * | 3/2022 | Chou | H01L 21/76895 |
| 2005/0184295 A1 * | 8/2005 | Huang | H01L 23/53295 |
| | | | 257/77 |
| 2018/0102364 A1 * | 4/2018 | Rastogi | H01L 29/4966 |
| 2018/0240883 A1 * | 8/2018 | Chanemougame | H01L 29/66795 |

* cited by examiner

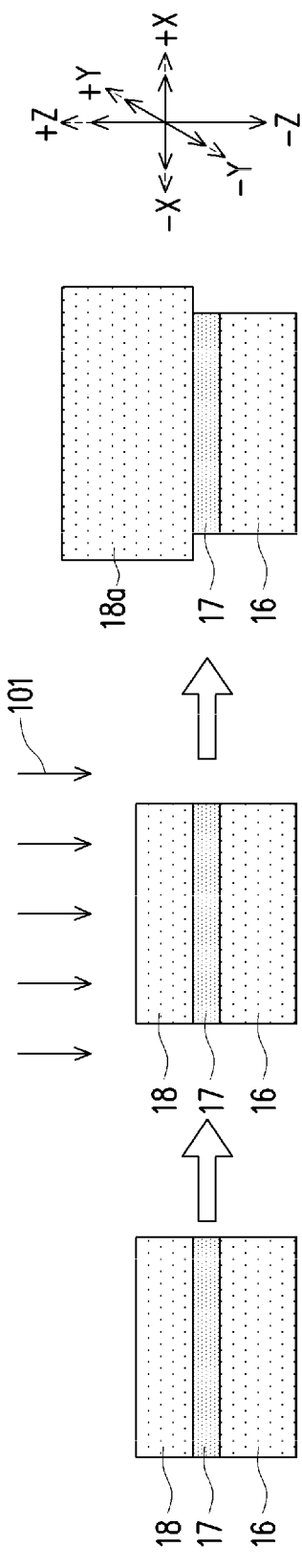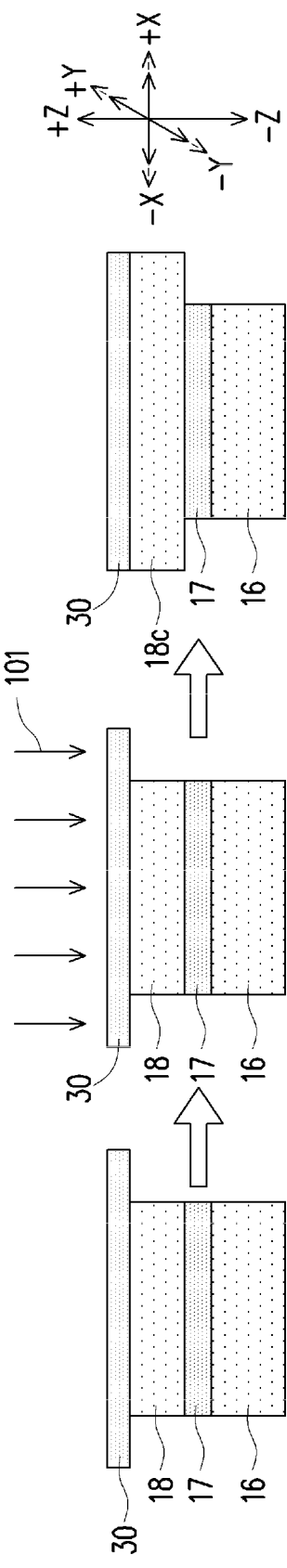

SEMICONDUCTOR DEVICE AND METHODS OF FORMING THE SAME

CROSS-REFERENCE TO RELATED APPLICATION

This application a continuation application of and claims the priority benefit of U.S. application Ser. No. 16/805,834, filed on Mar. 2, 2020, now allowed. The U.S. application Ser. No. 16/805,834 claims the priority benefit of U.S. provisional application Ser. No. 62/907,721, filed on Sep. 30, 2019. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 6A and FIG. 6B schematically illustrates a doping process for expanding a dielectric layer according to some embodiments of the disclosure.

DETAILED DESCRIPTION

Figure 1A:
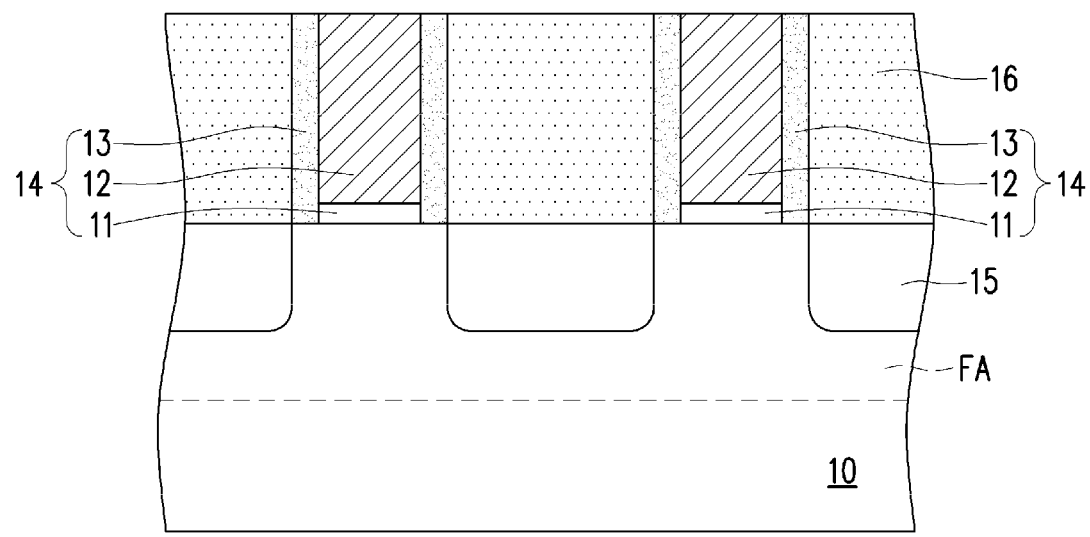
FIG. 1A to FIG. 1L are schematic cross-sectional views illustrating a method of forming a semiconductor device according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments in which the semiconductor device is FinFET device, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial material layer is formed over a substrate and patterned using a photolithography process. Spacers are formed alongside the patterned sacrificial material layer using a self-aligned process. The sacrificial material layer is then removed, and the remaining spacers may then be used to pattern the fins.

FIG. 1A to FIG. 1L are schematic cross-sectional views illustrating a method of forming a semiconductor device according to a first embodiment of the disclosure.

Referring to FIG. 1A, a substrate 10 is provided. In some embodiments, the substrate 10 is a semiconductor substrate, such as a bulk semiconductor substrate, a semiconductor-on-insulator (SOI) substrate, or the like, which may be doped (e.g., with a p-type or an n-type dopant) or undoped. The substrate 10 may be a semiconductor wafer, such as a silicon wafer. Generally, an SOI substrate includes a layer of a semiconductor material (e.g. silicon) formed on an insulator layer. The insulator layer may be, for example, a buried oxide (BOX) layer, a silicon oxide layer, or the like. The insulator layer is provided on a substrate, typically silicon or glass substrate. Other substrates, such as a multi-layered or gradient substrate may also be used. In some embodiments, the semiconductor material of the substrate 10 may include silicon; germanium; a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

Depending on the requirements of design, the substrate 10 may be a P-type substrate, an N-type substrate or a combination thereof and may have doped regions therein. The substrate 10 may be configured for an NMOS device, a PMOS device, an N-type FinFET device, a P-type FinFET device, other kinds of devices (such as, multiple-gate transistors, gate-all-around transistors or nanowire transistors) or combinations thereof. In some embodiments, the substrate 10 for NMOS device or N-type FinFET device may include Si, SiP, SiC, SiPC, InP, GaAs, AlAs, InAs, InAlAs, InGaAs or combinations thereof. The substrate 10 for PMOS device or P-type FinFET device may include Si, SiGe, SiGeB, Ge, InSb, GaSb, InGaSb or combinations thereof.

In some embodiments in which the substrate 10 is configured for a FinFET device, the substrate 10 may include a plurality of fins FA, shown as the portion above the dashed line in FIG. 1A (for the sake of brevity, fins FA are merely illustrated in FIG. 1A and not shown in the following figures). The fins FA protrude from a top surface of the substrate 10. In some embodiments, the substrate 10 has an isolation structure (such as the isolation structure 9 shown in FIG. 7) formed thereon. The isolation structure covers lower portions of the fins FA and exposes upper portions of the fins FA. In some embodiments, the isolation structure is a shallow trench isolation (STI) structure. It is noted that, the embodiments of the disclosure are not limited to FinFET device, but may also be configured as a planar MOSFET or other suitable kinds of transistors.

Still referring to FIG. 1A, in some embodiments, a plurality of gate structures 14 are formed on the substrate 10. The gate stack 14 may include a gate dielectric layer 11, a gate electrode 12 and spacers 13. The gate dielectric layer 11 may include silicon oxide, silicon nitride, silicon oxynitride, high-k dielectric materials, or combinations thereof. The high-k material may have a dielectric constant greater than about 4 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, the gate dielectric layer 11 may optionally include a silicate such as HfSiO, LaSiO, AlSiO, a combination thereof, or a suitable material.

The gate dielectric layer 11 may be formed by a suitable technique such as a thermal oxidation process, a chemical vapor deposition (CVD) process, an atomic layer deposition (ALD) process, or combinations thereof. In some embodiments, the gate dielectric layer 11 is formed between the gate electrode 12 and the substrate 10, but the disclosure is not limited thereto. In some other embodiment, the gate dielectric layer 11 may be formed between the gate electrode 12 and the substrate 10, and between the gate electrode 12 and the spacers 13 to surround the sidewalls and bottom of the gate electrode 12. In some embodiments, an interfacial layer such as a silicon oxide layer may further be formed between the gate dielectric layer 11 and the substrate 10.

The gate electrode 12 may include doped polysilicon, undoped polysilicon, or metal-containing conductive material. In some embodiments, the gate electrode 12 includes a work function metal layer and a metal filling layer on the work function metal layer. The work function metal layer may be an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The metal filling layer includes copper, aluminum, tungsten, or other suitable metallic materials. In some embodiments, the gate electrode 12 may further include a liner layer, an interface layer, a seed layer, an adhesion layer, a barrier layer, a combination thereof or the like. The gate electrode 12 may be formed by suitable processes such as ALD, CVD, physical vapor depositon (PVD), plating process, or combinations thereof. In some embodiments, the formation of the gate electrode 12 includes a gate replacement process.

The spacers 13 are disposed on sidewalls of the gate dielectric layer 11 and the gate electrode 12. The spacer 13 may be a single layer structure or a multi-layer structure. In some embodiments, the spacer 13 includes $SiO_2$, SiN, SiCN, SiOCN, SiC, SiOC, SiON, or the like, or combinations thereof. In some embodiments, the top surfaces of the spacers 13 are substantially coplanar with the top surface of the gate electrode 12, but the disclosure is not limited thereto. In alternative embodiments, the top surface of the gate electrode 12 is lower than the top surfaces of the spacers 13, and a capping layer (not shown) may be disposed on the gate electrode 12 and between the spacers 13.

Still referring to FIG. 1A, the substrate 10 includes source/drain (S/D) regions 15. In some embodiments, the S/D regions 15 are formed in the substrate 10 and on sides of the gate structure 14. In other words, the gate structure 14 is formed on the substrate 10 and between the S/D regions 15. In some embodiments, the S/D regions 15 are doped regions configured for a PMOS device or P-type FinFET and include p-type dopants, such as boron, $BF_2^+$, and/or a combination thereof. In alternative embodiments, the S/D regions 15 are doped regions configured for a NMOS device or N-type FinFET, and include n-type dopants, such as phosphorus, arsenic, and/or a combination thereof. The S/D regions 15 may be formed by an ion implanting process with the gate structure 14 as a mask. However, the disclosure is not limited thereto.

In some other embodiments, the S/D regions 15 are strained layers formed by epitaxial growing process such as selective epitaxial growing process. In some embodiments, recesses are formed in the substrate 10 on sides of the gate structure 14, and the strained layers are formed by selectively growing epitaxy layers from the substrate 10 exposed in the recesses. In some embodiments, the strained layers include silicon germanium (SiGe), SiGeB, Ge, InSb, GaSb, InGaSb or combinations thereof for a P-type MOS or FinFET device. In alternative embodiments, the strained layers include silicon carbon (SiC), silicon phosphate (SiP), SiCP, InP, GaAs, AlAs, InAs, InAlAs, InGaAs or a SiC/SiP multi-layer structure, or combinations thereof for an N-type MOS or FinFET device. In some embodiments, the strained layers may be optionally implanted with an N-type dopant or a P-type dopant as needed.

In some embodiments, the top surfaces of the S/D regions 15 may be substantially coplanar with the top surface of the substrate 10. In some other embodiments, the S/D regions 15 may extend upwardly along the sidewalls of the corresponding spacers 13, and have top surfaces higher than the top surface of the substrate 10. It is noted that, the cross-sectional shape of the S/D region 15 shown in the figures is merely for illustration, and the disclosure is not limited thereto. The S/D region 15 may have any suitable shape as needed. In some embodiments, the substrate 10 may further include lightly doped regions formed therein. For example, lightly doped drain (LDD) regions may be formed adjacent to the S/D regions 15 in the substrate 10.

Still referring to FIG. 1A, a dielectric layer 16 is formed on the substrate 10 and laterally aside the gate structure 14 to cover sidewalls of the gate structure 14. The top surface of the dielectric layer 16 may be substantially coplanar with the top surfaces of the gate structures 14. In some embodiments, the dielectric layer 16 may also be referred to as a first dielectric layer or a first interlayer dielectric layer (ILD). The dielectric layer 16 may include silicon oxide, carbon-containing oxide such as silicon oxycarbide (SiOC), silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), combinations thereof and/or other suitable dielectric materials. In some embodiments, the dielectric layer 16 may include low-k dielectric material with a dielectric constant lower than 4, or extreme low-k (ELK) dielectric material with a dielectric constant lower than 2.5. In some embodiments, the low-k material includes a polymer based material, such as benzocyclobutene (BCB), FLARE®, or SILK®; or a silicon dioxide based material, such as hydrogen silsesquioxane (HSQ) or SiOF. The dielectric layer 16 may be a single layer structure or a multi-layer structure. The dielectric layer 16 may be formed by CVD, plasma enhanced CVE (PECVD), flowable CVD (FCVD), spin coating or the like.

In some embodiments, an etching stop layer (not shown) may further be formed between the dielectric layer 16 and the substrate 10, and between the dielectric layer 16 and the gate structures 14. The etching stop layer may also be referred to as a contact etch stop layer (CESL). The CESL includes a material different from that of the dielectric layer 16. In some embodiments, the CESL includes SiN, SiC, SiOC, SiON, SiCN, SiOCN, or the like, or combinations thereof. The etching stop layer may be formed by CVD, PECVD, FCVD, ALD or the like.

Figure 1B:
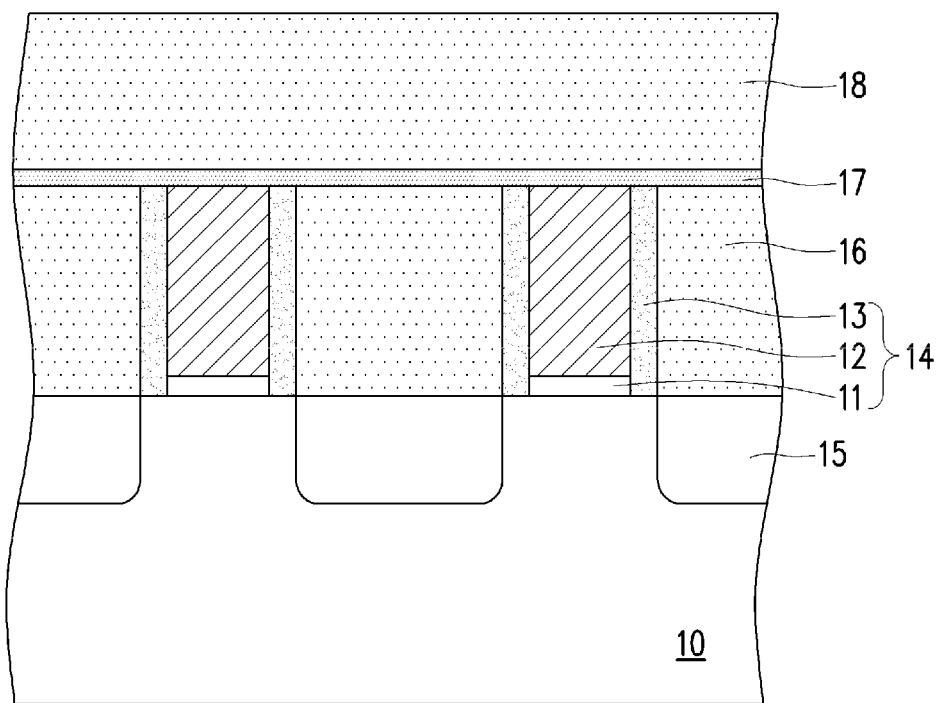

Referring to FIG. 1B, an etch stop layer 17 and a dielectric layer 18 are sequentially formed on the gate structure 14 and the dielectric layer 16 by suitable processes such as by CVD, PECVD, FCVD, spin coating or the like. The etch stop layer 17 may also be referred to as a first etch stop layer, and the dielectric layer 18 may also be referred to as a second dielectric layer or second ILD. The material of the dielectric layer 18 may be selected from the same candidate materials of the dielectric layer 16, and the material of the dielectric layer 18 may be the same as or different from the material of the dielectric layer 16. The material of the second dielectric layer 18 is different from the material of the first etch stop layer 17.

In some embodiments, the second dielectric layer 18 includes a dielectric material having relatively low density. In some embodiments, the density of the second dielectric layer 18 is lower than the density of the first etch stop layer 17. In some embodiments, the density of the second dielectric layer 18 ranges from 2 g/cm$^3$ to 2.65 g/cm$^3$, the density of the first etch stop layer 17 ranges from 2.6 g/cm$^3$ to 4 g/cm$^3$, for example, but the disclosure is not limited thereto. In some embodiments, the second dielectric layer 18 includes an oxide material, and the first etch stop layer 17 includes a non-oxide material. In some embodiments, the second dielectric layer 18 includes silicon oxide, silicon oxycarbide (SiOC), silicon oxynitride (SiON), oxycarbonitride (SiOCN) or the like, or any other suitable dielectric material having low density, or combinations thereof. The first etch stop layer 17 may include silicon nitride, SiCN, aluminum oxide (AlO), aluminum nitride (AlN), aluminum oxynitride (AlON) or the like, or combinations thereof.

Figure 1C:
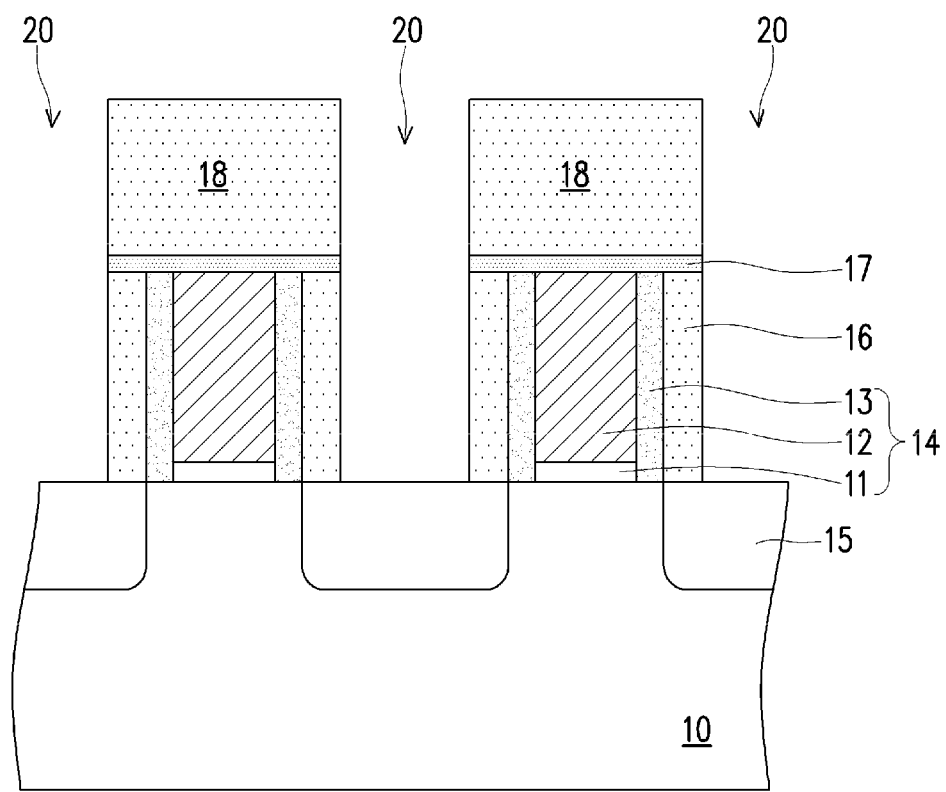

Referring to FIG. 1C, a patterning process is performed on the second dielectric layer 18, the first etch stop layer 17 and the first dielectric layer 16, so as to form contact holes 20 therein. The patterning process may include a photolithograph and one or more etching processes. In some embodiments, a patterned mask layer (not shown) such as a patterned photoresist is formed on the second dielectric layer 18. The patterned mask layer has openings corresponding to the intended locations of the subsequently formed via holes 25. Thereafter, portions of the second dielectric layer 18, first etch stop layer 17 and the first dielectric layer 16 are removed by using the patterned mask layer as an etch mask, so as to form the contact holes 20. The contact holes 20 penetrate through the second dielectric layer 18, the first etch stop layer 17 and the first dielectric layer to expose portions of the top surfaces of the S/D regions 15 of the substrate 10.

Figure 1D:
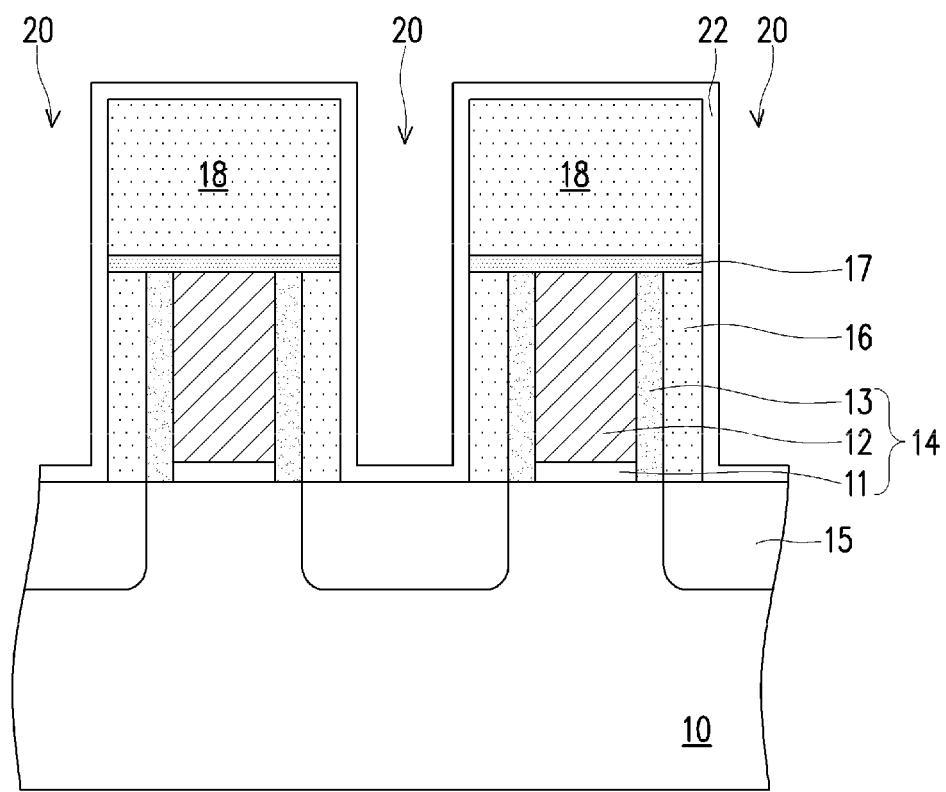

Referring to FIG. 1D, a sacrificial material layer 22 is formed over the substrate 10 to partially fill the contact holes 20 and cover the top surface of the second dielectric layer 18. In some embodiments, the sacrificial material layer 22 is formed along the surfaces of the second dielectric layer 18, the first etch stop layer 17 and the first dielectric layer 16. In other words, the sacrificial material layer 22 lines the contact holes 20 and the top surface of the second dielectric layer 18. In some embodiments, the sacrificial material layer 22 is a conformal layer. Herein, "conformal layer" refers to a layer having a substantially equal thickness extending along the region on which the layer is formed. The material of the sacrificial material layer 22 is different from the materials of the second dielectric layer 18, the first etch stop layer 17 and the first dielectric layer 16. In some embodiments, the sacrificial material layer 22 includes a semiconductor material, such as silicon. However, the disclosure is not limited thereto. The sacrificial material layer 22 may also include dielectric material, such as metal oxide, the metal oxide may include aluminum oxide (AlO), but the disclosure is not limited thereto. In some embodiments, the sacrificial material layer 22 is formed by a suitable deposition process such as CVD, ALD, or the like, or combinations thereof.

Figure 1E:
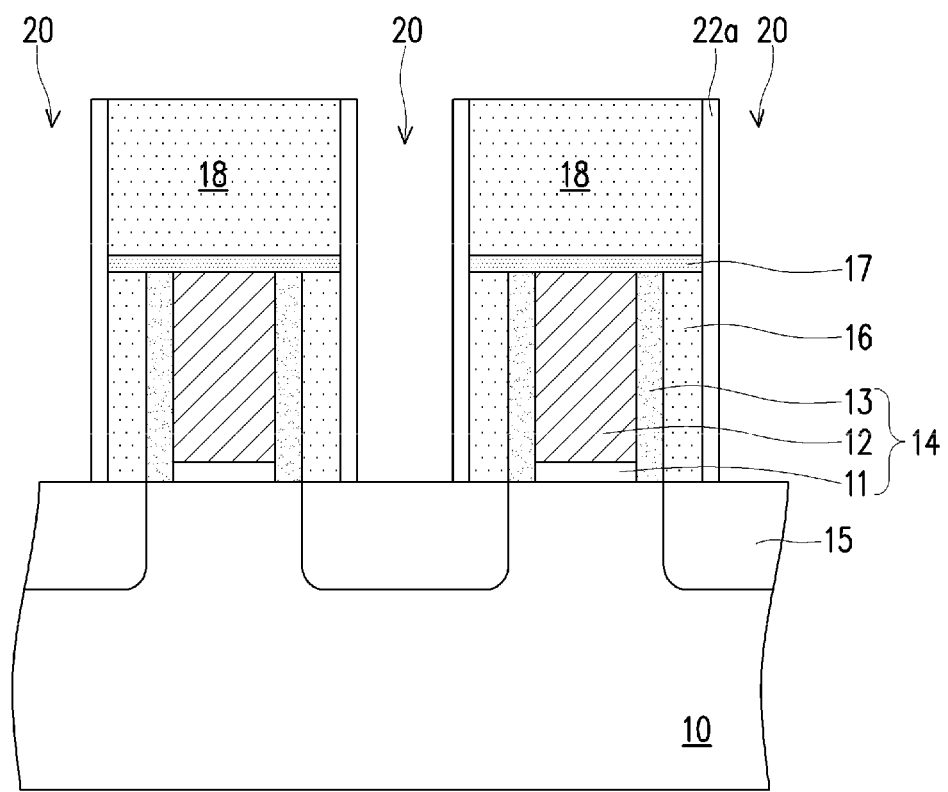

Referring to FIG. 1D and FIG. 1E, in some embodiments, a portion of the sacrificial material layer 22 is removed to expose the top surfaces of the dielectric layer 18 and the S/D regions 15, and a sacrificial layer 22a is thus formed. For example, an etching back process is performed to remove horizontal portions of the sacrificial material layer 22 covering the top surfaces of the dielectric layer 18 and the S/D regions 15, and the sacrificial layer 22a is remained in the contact hole 20 to cover sidewalls of the second dielectric layer 18, the first etch stop layer 17 and the first dielectric layer 16.

Figure 1F:
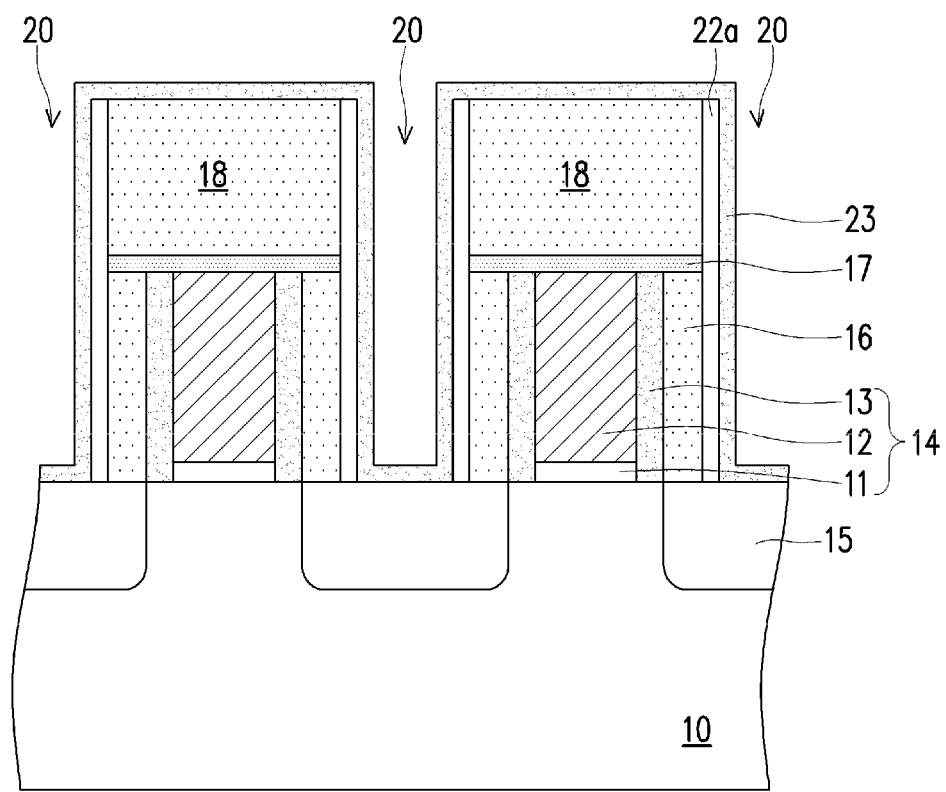

Referring to FIG. 1F, a contact spacer material layer 23 is formed over the substrate 10 to partially fill the contact holes 20 and cover the top surfaces of the second dielectric layer 18 and the sacrificial layer 22a. In some embodiments, the contact spacer material layer 23 is a conformal layer. The contact spacer material layer 23 includes a material different from those of the second dielectric layer 18 and the sacrificial layer 22a. For example, the contact spacer material layer 23 may include a dielectric material, such as silicon nitride (SiN), silicon oxynitride (SiON), or the like or combinations thereof. The contact spacer material layer 23 may be formed a suitable deposition process, such as CVD, ALD, PECVD or the like, or combinations thereof.

Figure 1G:
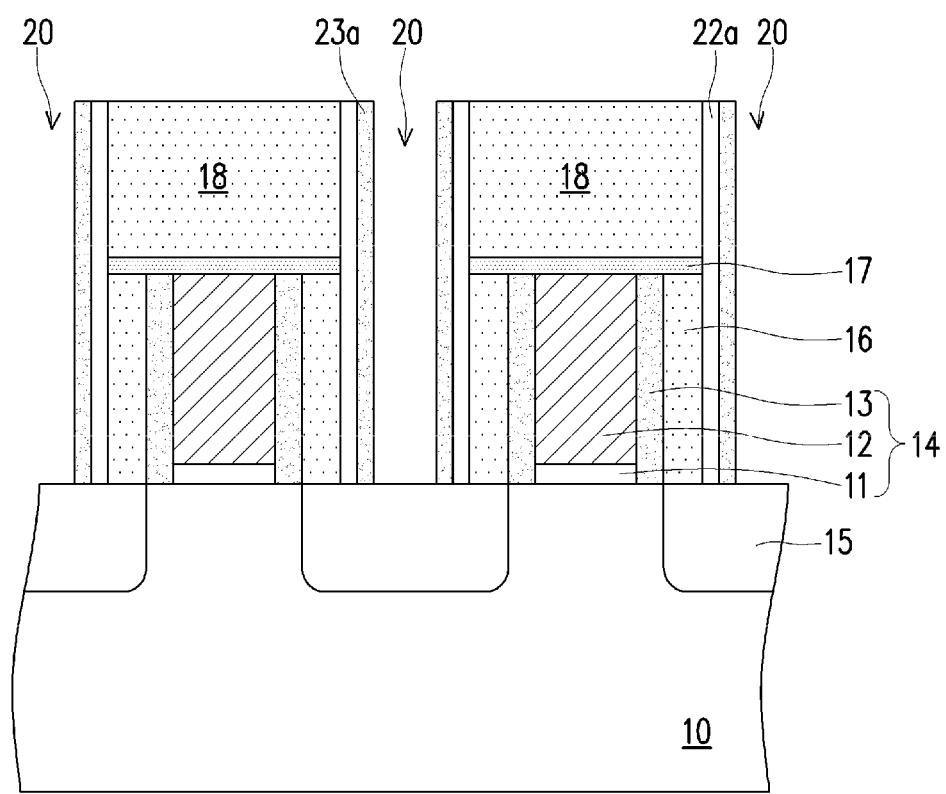

Referring to FIG. 1F and FIG. 1G, a portion of the contact spacer material layer 23 is removed to expose the top surfaces of the dielectric layer 18, the sacrificial layer 22a, and the S/D regions 15, and a contact spacer 23a is thus formed. For example, an etch back process is performed to remove the horizontal portions of the contact spacer material layer 23 covering the top surfaces of the dielectric layer 18, the sacrificial layer 22a and the S/D regions 15. As a result, the contact spacer 23 is remained in the via hole 20 covering sidewalls of the sacrificial layer 22a.

Figure 1H:
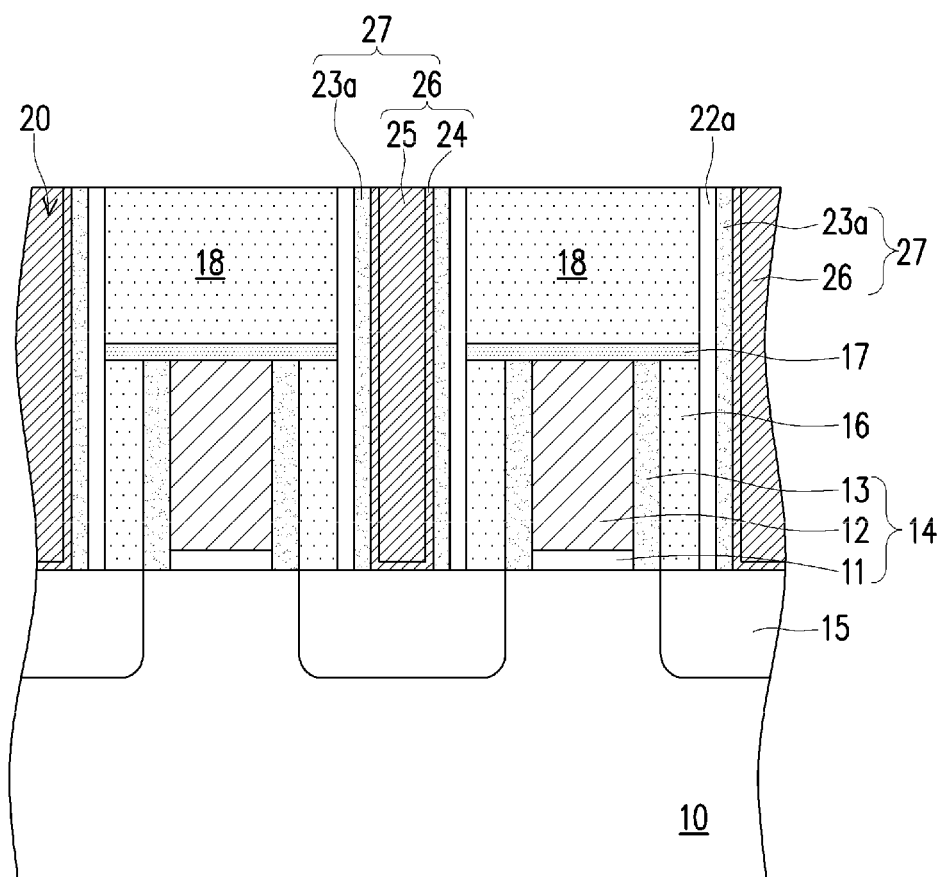

Referring to FIG. 1H, thereafter, contacts 26 are formed in the contact holes 20 to electrically connect to the S/D regions 15. In some embodiments, the contact 26 includes a barrier layer 24 and a conductive layer (or conductor) 25 on the barrier layer 24. The barrier layer 24 may include titanium, tantalum, titanium nitride, tantalum nitride, manganese nitride or a combination thereof. The conductive layer 25 may include metal, such as tungsten (W), copper (Cu), Ru, Ir, Ni, Os, Rh, Al, Mo, Co, alloys thereof, combinations thereof or any metallic material with suitable resistance and gap-fill capability.

In some embodiments, the contact 26 may be formed by following processes: a barrier material layer and a conductive material layer are formed over the substrate 10 by suitable techniques such as sputtering, CVD, PVD, electrochemical plating (ECP), electrodeposition (ELD), ALD, or the like or combinations thereof. The barrier material layer and the conductive material layer fill in the contact hole 20 and cover the top surface of the dielectric layer 18. Thereafter, a planarization process such as chemical mechanical polishing (CMP) is then performed to remove excess portions of the conductive material layer and the barrier material layer over the top surfaces of the dielectric layer 18, the sacrificial layer 22a and the contact spacer 23a, such that the top surfaces of the dielectric layer 18, the sacrificial layer 22a and the contact spacer 23a are exposed. In some embodiments, the top surfaces of the barrier layer 24 and the conductive layer 25 are substantially coplanar with the top surface of the dielectric layer 18, the top surface of the sacrificial layer 22a and the top surface of the contact spacer 23.

Still referring to FIG. 1H, in some embodiments, the barrier layer 24 surrounds sidewalls and bottom surface of the conductive layer 25. In other words, the barrier layer 24 is located between the conductive layer 25 and the S/D region 15, and between the conductive layer 25 and the contact spacer 23a. The barrier layer 24 serves as a diffusion barrier to prevent the diffusion of the metal atoms of the conductive layer 25 into adjacent dielectric features. In the embodiments, the contact spacer 23a is disposed on sidewalls of the contact 26. The contact 26 and the contact spacer 23a constitute a contact structure 27. In some embodiments, the dimension of the contact 26 may be controlled by adjusting the thickness of the contact spacer 23a. The contact spacer 23a is optionally formed and may be omitted in some other embodiments. In other words, in some other embodiments, the contact structure 27 includes the contact 26 without contact spacers on sidewalls thereof.

As shown in the FIG. 1H, after the contact 26 is formed, the sacrificial layer 22a is laterally sandwiched between the contact structure 27 and the second dielectric layer 18, between the contact structure 27 and the first etch stop layer 27, and between the contact structure 27 and the first dielectric layer 16.

Figure 1I:
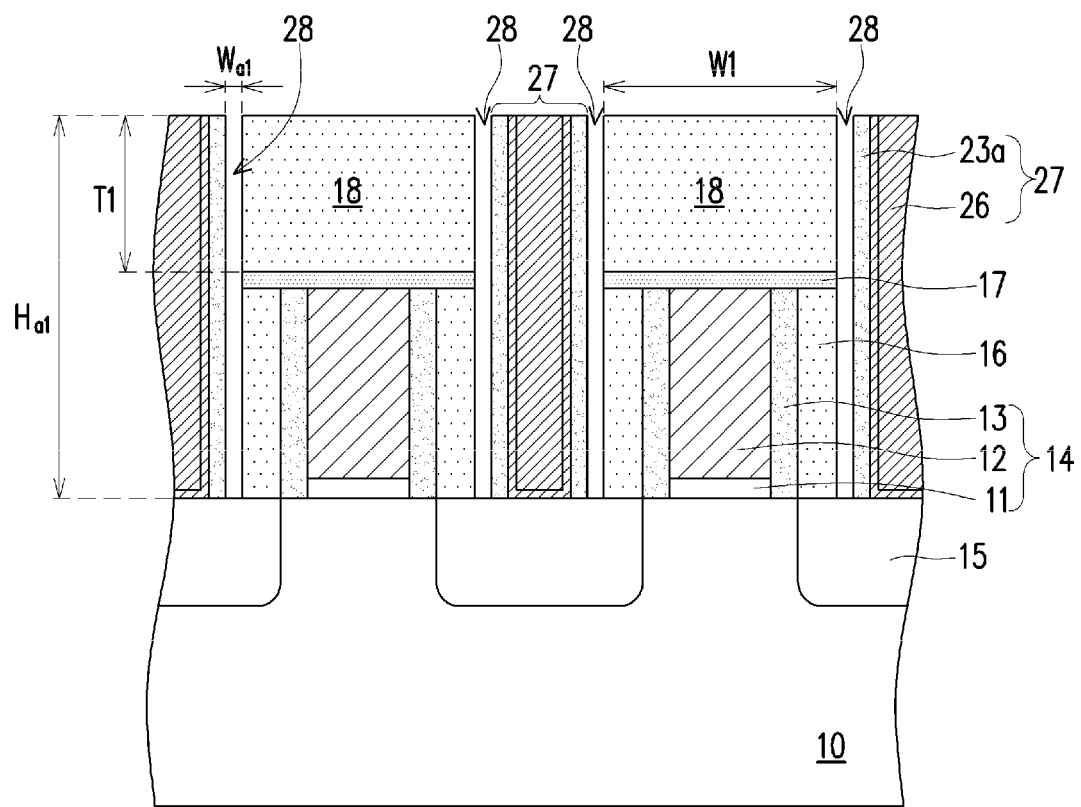

Referring to FIG. 1H and FIG. 1I, the sacrificial layer 22a is then removed by an etching process such as a dry etching process, a wet etching process or a combination thereof, so as to form an air gap 28 at the location previously occupied by the sacrificial layer 22a. In other words, the air gap 28 is laterally between the contact structure 27 (e.g. the contact spacer 23a thereof) and second dielectric layer 18, laterally between the contact structure 27 and the first etch stop layer 17, and laterally between the contact structure 27 and the first dielectric layer 16. At this point, the contact structure 27 is laterally spaced apart from the second dielectric layer 18, the first etch stop layer 17 and the first dielectric layer 16 by the air gap 28 there between. In some embodiments, the width $W_{a1}$ of the air gap 28 substantially equals to the thickness of the removed sacrificial layer 22a, and the height $H_{a1}$ of the air gap 28 is substantially equal to the height of the contact structure 27. In some embodiments, portions of the top surfaces of the S/D regions 15 are exposed at the bottom of the air gap 28. The sidewalls of the second dielectric layer 18, the first etch stop layer 17, the first dielectric layer 16 and the sidewalls of the contact structure 27 are exposed by the air gap 28.

Figure 1J:
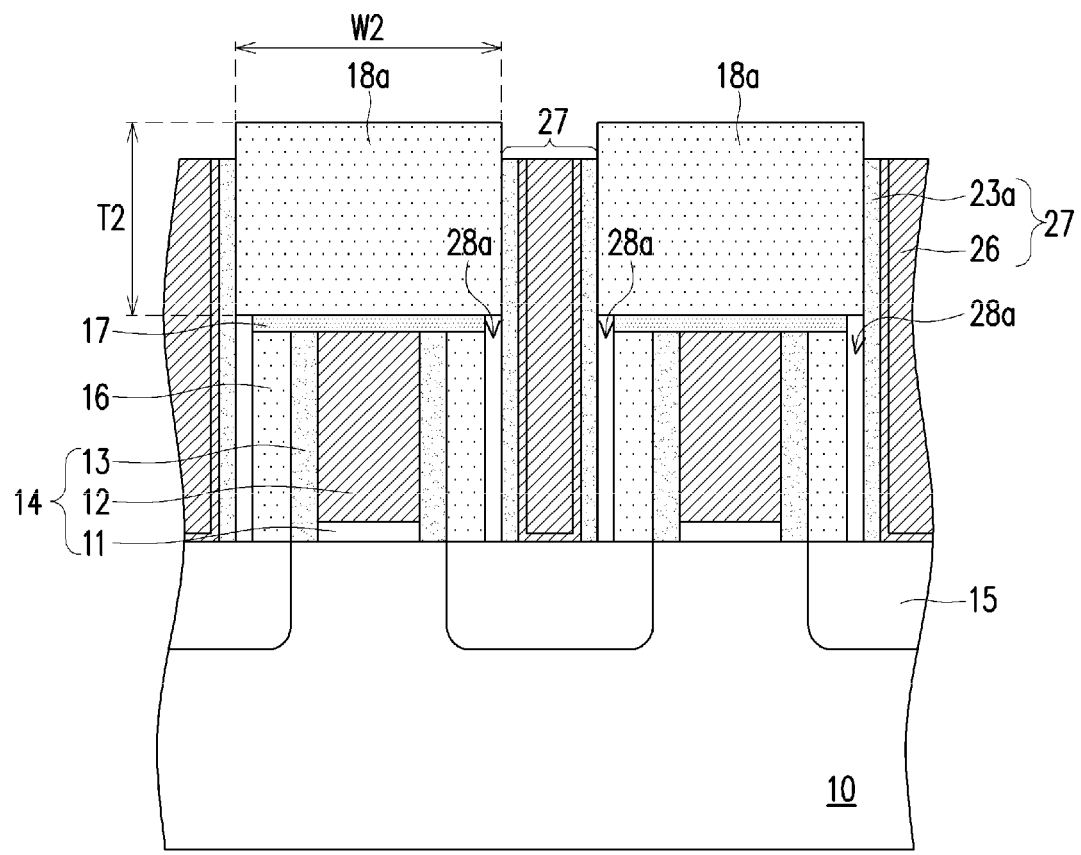

Referring to FIG. 1I and FIG. 1J, a sealing process is performed to seal a top of the air gap 28, and an air gap 28a is remained between a lower portion of the contact structure 27 and the adjacent first dielectric layer 16/first etch stop layer 17. FIG. 6A schematically illustrates the sealing process according to the first embodiment of the disclosure. For the sake of brevity, FIG. 6A merely shows the dielectric layers 16/18 and the first etch stop layer 17.

Referring to FIG. 1I to FIG. 1J and FIG. 6A, in some embodiments, the sealing process includes performing a doping process 101 on the dielectric layer 18 to form a doped and expanded dielectric layer 18a.

In some embodiments, after the air gap 28 is formed, the doping process 101 is performed on the dielectric layer 18, thereby causing an expansion of the dielectric layer 18 and forming the expanded dielectric layer 18a. In some embodiments, the dielectric layer 18 is expanded because it is formed of dielectric material having low density (e.g. oxide material) which shows a remarkable volume expansion when subjected to doping process. In some embodiments, the doping process may use various kinds of dopants (e.g. dopant atoms) as long as the dopants can be doped into the second dielectric layer 18. In some embodiments, the dopants may include semiconductor atoms, metal atoms. In some embodiments, the dopants may include IIIA, IVA, VA element atoms or inert gas atoms. For example, the dopants may include Ge, B, P, Ar, Al, Ga, Si, N, Xe, As, or the like, or combinations thereof. In some embodiments, the doping depth/thickness range and/or the doping concentration are tunable by adjusting the doping energy and/or the dosage of the doping process 101, and the expansion of the dielectric layer 18 may be controlled by adjusting the process parameter of the doping process 101. In some embodiments, the doping depth/thickness may range from 0-1000 nm, for example.

Still referring to FIG. 1I to FIG. 1J and FIG. 6A, in some embodiments, before performing the doping process 101, as shown in FIG. 1I, the second dielectric layer 18 has a width W1 and a thickness T1; the second dielectric layer 18 is laterally spaced apart from the contact structure 27 by the air gap 28 therebetween, and the top surface of the second dielectric layer 18 is substantially coplanar with the top surface of the contact structure 27. In some embodiments, during the doping process, the dielectric layer 18 may expands toward any direction without obstacles. In detail, the dielectric layer 18 may expand in lateral direction (e.g. directions +X, −X, +Y, −Y) until touching the contact structure 27, and expand upwardly in vertical direction (e.g.

direction +Z). Since there has no other layer disposed on the second dielectric layer 18, the expansion of the second dielectric layer 18 in the direction +Z is not constrained. In some embodiments, since the first etch stop layer 17 is disposed underlying the second dielectric layer 18, the expansion of the second dielectric layer 18 in the direction −Z is constrained by the first etch stop layer 17. In some embodiments, the second dielectric layer 18 substantially has no expansion in direction −Z, but the disclosure is not limited thereto. In some embodiments, the lateral expansion of the second dielectric layer 18 makes the top of the air gap 28 (previously between second dielectric layer 18 and the contact structure 27) be occupied and sealed by the expanded dielectric layer 18a. In some embodiments, when the second dielectric layer 18 expands in lateral directions and laterally extends beyond sidewalls of the first etch stop layer 17, the portion of the expanding second dielectric layer 18 laterally protruding the first etch stop layer 17 may further expand downwardly in the direction −Z to fill a portion of the air gap 28 laterally between the first etch stop layer 17 and the contact structure 27 without being constrained by the first etch stop layer 17 (e.g. shown in FIG. 5B). In some embodiments, the doping process is stopped until the expanded dielectric layer 18a (e.g. completely) seals the top of the air gap 28. In some embodiments, the expanded dielectric layer 18a physically contact the upper portions of the sidewalls of the contact structure 27. In other words, the dielectric layer 18a leans against the contact structure 27. There may be free of chemical bonds between the dielectric layer 18a and the contact structure 27.

Referring to FIG. 1J, in some embodiments, the expanded dielectric layer 18a has a width W2 and a thickness T2, which are larger than the width W1 and the thickness T1 of the dielectric layer 18, respectively. In some embodiments, the width W2 of the expanded dielectric layer 18a is substantially equal to the sum value of the width W1 of the dielectric layer 18 and the width $W_{a1}$ of the air gap 28 (FIG. 1I). In some embodiments, the expansion of the dielectric layer 18 in lateral direction would be constrained by the contact structure 27 after touching the contact structure 17, while the expansion of the dielectric layer 18 is vertical direction +Z is not constrained by any obstacle, therefore, the dielectric layer 18 may have more expansion in vertical direction +Z. In other words, the difference (T2−T1) between the thickness T2 of the expanded dielectric layer 18a and the thickness T1 of the dielectric layer 18 may be larger than the difference (W2−W1) between the width W2 of the expanded dielectric layer 18a and the width W1 of the dielectric layer 18.

Still referring to FIG. 1J, the expanded second dielectric layer 18a laterally extends beyond sidewalls of the first etch stop layer 17 and the first dielectric layer 16 and contact an upper portion of the contact structure 27. The expanded second dielectric layer 18a vertically protrudes from the top surface of the contact structure 27. The top of the air gap 28 is occupied and sealed by the expanded dielectric layer 18a, and the air gap 28a is remained and defined by the sidewalls of the first dielectric layer 16/first etch sop layer 17, the sidewalls of the contact structure 27, the top surface of the substrate 10 (e.g. the S/D regions 15) and the bottom surface of the expanded dielectric layer 18a.

In some embodiments, the second dielectric layer 18a is doped, while the underlying first etch stop layer 17 is undoped. In some other embodiments, during the doping process 101 of the second dielectric layer 18a, the first etch stop layer 17 may be unintentionally doped and thus includes dopants therein. The dopants in the first etch stop layer 17 is substantially the same as the dopants in the second dielectric layer 18a, and the doping concentration of the first etch stop layer 17 is less than the doping concentration of the second dielectric layer 18a. In some embodiments, since the first etch stop layer 17 is a dielectric material having relative high density, the doping may substantially cause no expansion of the first etch stop layer 17. In some embodiments, the dopants may also be found in the contact 26 and contact spacer 23a of the contact structure 27. In other words, the contact structure 27 may include dopants the same as the dopants contained in the dielectric layer 18a.

In some embodiments, the first dielectric layer 16 is undoped. In some other embodiments, the first dielectric layer 16 may also be unintentionally doped by the doping process 101 and thus includes dopants therein. The doping concentration of the first dielectric layer 16 is much less than the doping concentration of the second dielectric layer 18a. In some embodiments, the doping may cause a minor expansion of the first dielectric layer 16 (e.g. shown in FIG. 5C/5D). Since the doping concentration of the first dielectric layer 16 is very low, the expansion degree of the first dielectric layer 16 is very small.

Figure 1K:
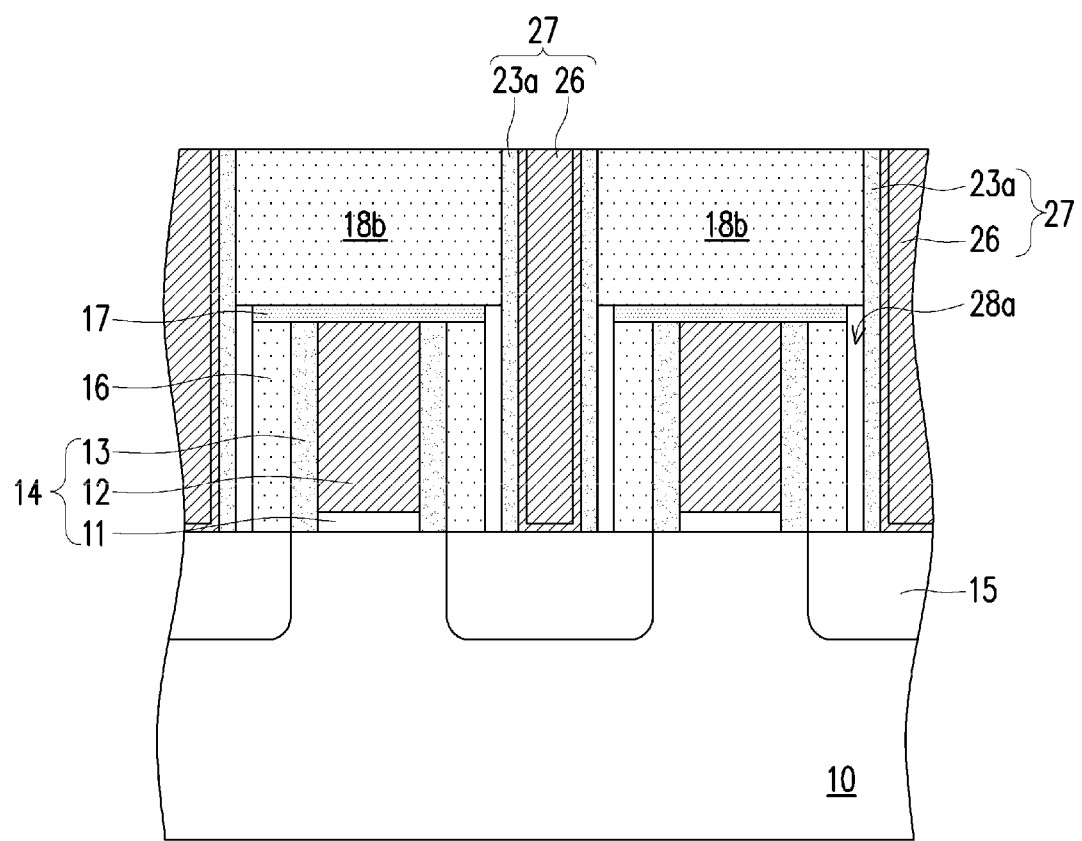

Referring to FIG. 1K, in some embodiments, a planarization process is then performed to remove excess portions of the expanded dielectric layer 18a protruding over the top surface of the contact structure 27. The planarization process may include a CMP process, for example. After the planarization process is performed, a second dielectric layer 18b is formed, and the top surface of the second dielectric layer 18b is substantially coplanar with the top surface of the contact structure 27.

Figure 1L:
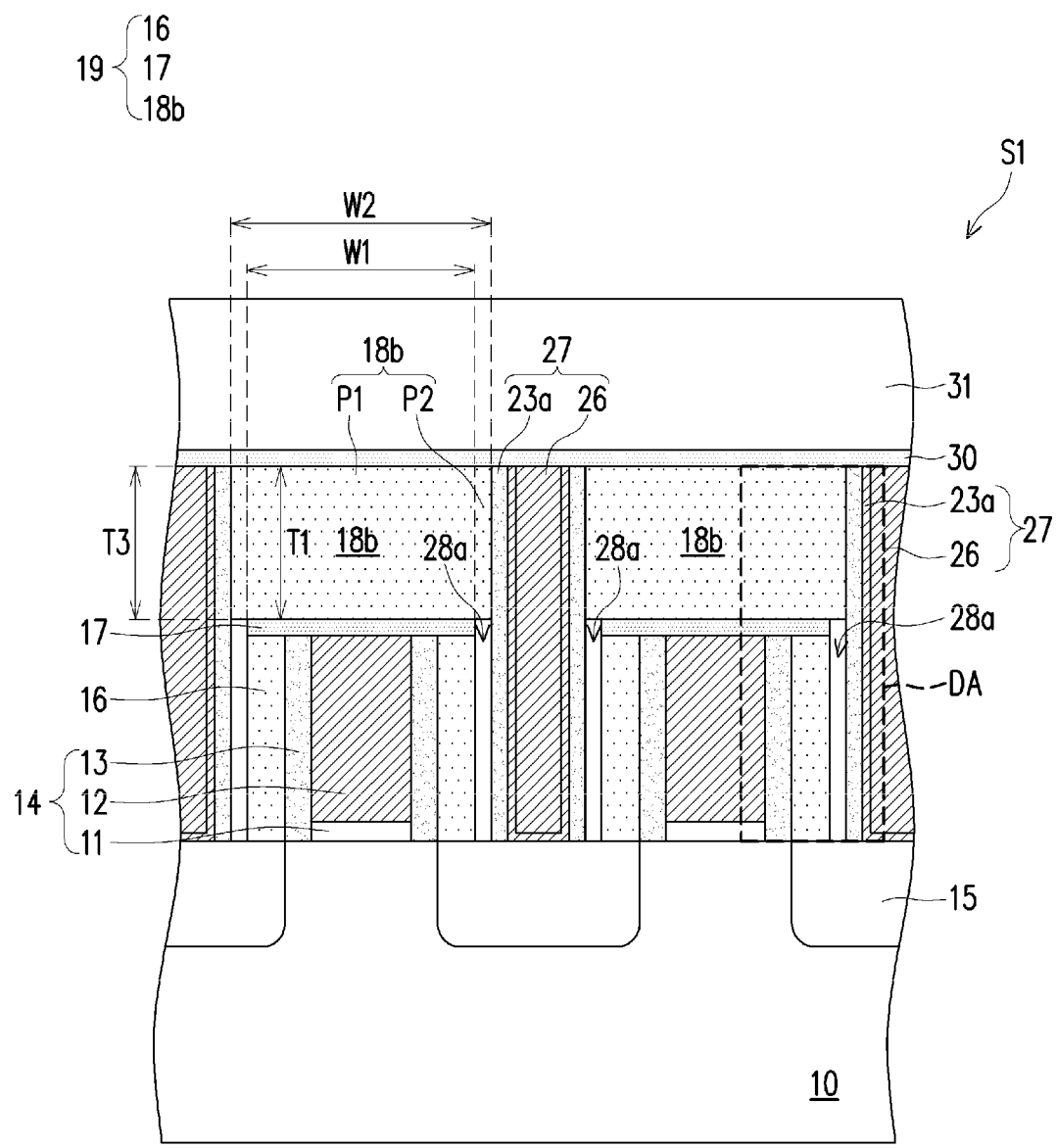

Referring to FIG. 1L, thereafter, a second etch stop layer 30 is formed on the second dielectric layer 18b and the contact structure 27. And a dielectric layer 31 is then formed on the second etch stop layer 30. The material of the second etch stop layer 30 may be selected from the same candidate materials of the etch stop layer 17, and the material of the second etch stop layer 30 may be the same as or different from the material of the first etch stop layer 17. For example, the second etch stop layer 30 includes a dielectric material having a relative high density, such as non-oxide material. In some embodiments, the second etch stop layer 30 includes silicon nitride, SiCN, or the like or combinations thereof. The material of the dielectric layer 30 may be selected from the same candidate materials of the dielectric layer 16/18.

As such, a semiconductor device S1 is thus formed. The semiconductor device S1 includes the substrate 10, the S/D regions 15, the gate structure 14, the first dielectric layer 16, the first etch stop layer 17, the second dielectric layer 18b, the contact structure 27, the second etch stop layer 30, and the overlying dielectric layer 31. In some embodiments, further processes may be performed to form gate contacts, via plugs and overlying interconnection structures (shown in FIG. 7).

Figure 5A:
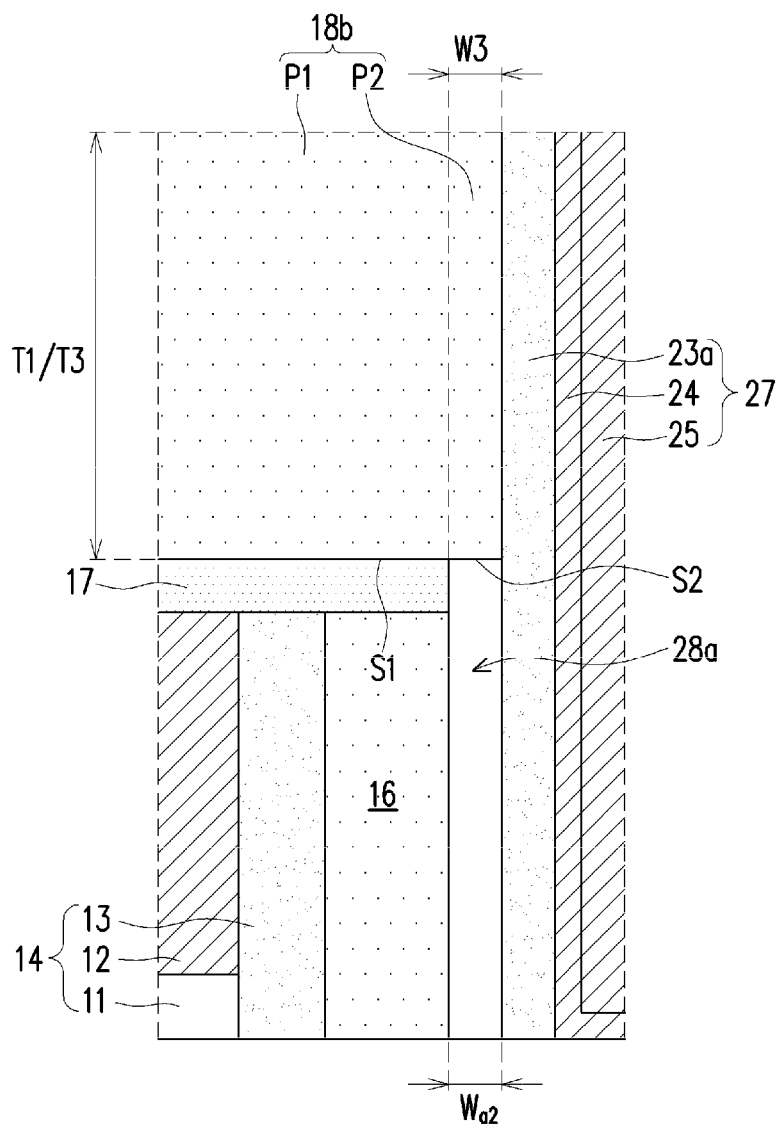
FIG. 5A to FIG. 5D illustrates enlarged cross-sectional views of a dashed area DA outlined in FIG. 1L according to some embodiments of the disclosure.

FIG. 5A illustrates an enlarged cross-sectional view in a dashed area DA outlined in FIG. 1L according to some embodiments of the disclosure.

Referring to FIG. 1L and FIG. 5A, in some embodiments, the first dielectric layer 16 is laterally aside and covering sidewalls of the gate structure 14. The top surface of the first dielectric layer 16 may be substantially coplanar with the top surface of the gate structure 14. The first etch stop layer 17 and the second dielectric layer 18b are formed on the top surfaces of the gate structure 14 and the first dielectric layer 16. In some embodiments, the first dielectric layer 16, the first etch stop layer 17 and the second dielectric layer 18b are collectively referred to as a dielectric structure 19. The contact structure 27 is located laterally aside and penetrates through the second dielectric layer 18b, the first etch stop layer 17 and the first dielectric layer 16 (i.e. the dielectric structure 19) to electrically connect to the S/D region 15 of the substrate 10. In some embodiments, the upper portion of the contact structure 27 is in contact with the second dielectric layer 18b of the dielectric structure 19, while the lower portion of the contact structure 27 is laterally spaced apart from the first dielectric layer 16 and the first etch stop layer 17 of the dielectric structure 19 by the air gap 28a therebetween.

In other words, the second dielectric layer 18b laterally protrudes from sidewalls of the first etch stop layer 17 and the first dielectric layer 16 to be in contact with the upper portion of the contact structure 27. In some embodiments, the top surface of the second dielectric layer 18b of the dielectric structure 19 is substantially coplanar with the top surface of the contact structure 27.

In some embodiments, the second dielectric layer 18b includes a first portion (or referred to as a body portion) P1 and a second portion (or referred to as an expanded portion or an extending portion) P2. The first portion P1 is located on and in contact with the first etch stop layer 17. The second portion P2 is laterally between the first portion P1 and the contact structure 27 and overlapped with the air gap 28a in a direction perpendicular to the top surface of the substrate 10. The second portion P2 serves as the sealing material for sealing the air gap 28a.

In some embodiments, the width and thickness of the first portion P1 of the second dielectric layer 18b is substantially the same as those of the second dielectric layer 18 before the doping process. The width W3 of the second portion P2 equals to the difference (W2−W1) between the width W2 of the second dielectric layer 18b and the width W1 of the first dielectric layer 18, and may substantially equals to the width $W_{a1}$ of the air gap 28 (FIG. 1I). In some embodiments, the width $W_{a2}$ of the air gap 28a may be substantially equal to the width $W_{a1}$ of the air gap 28 (FIG. 1I). In other words, the width W3 of the second portion P2 of the second dielectric layer 18b may be substantially equal to the width $W_{a1}$ of the air gap 28. However, the disclosure is not limited thereto.

In some embodiments, the thickness T3 of the second portion P2 may be substantially equal to the thickness T1 of the first portion P1, and the bottom surface S2 of the second portion P2 may be substantially coplanar with the bottom surface S1 of the first portion P1. However, the disclosure is not limited thereto.

In some embodiments, the sidewalls of the first etch stop layer 17 may be substantially aligned with the sidewalls of the first dielectric layer 16, and the air gap 28a may be disposed laterally between the first dielectric layer 16 and the contact structure 27, and laterally between the first etch stop layer 17 and the contact structure 27, and the air gap 28a may have a substantially uniform width $W_{a2}$ from top to bottom. In other words, the contact structure 27 is spaced apart from the first etch stop layer 17 and the first dielectric layer 16 by the air gap 28a therebetween. However, the disclosure is not limited thereto.

In some embodiments, the second dielectric layer 18b is doped and includes dopants distributed therein. The first etch stop layer 17 and the first dielectric layer 16 may be doped or undoped, respectively. In other words, the first etch stop layer 17 and the first dielectric layer 16 may or may not include dopants therein, respectively. In some embodiments, both of the first etch stop layer 17 and the first dielectric layer 16 are undoped. In embodiments, the first etch stop layer 17 is doped, while the first dielectric layer 16 is undoped. In some embodiments, the first etch stop layer 17 is undoped, while the first dielectric layer 16 is doped. In some embodiments, both of the first etch stop layer 17 and the first dielectric layer 16 are doped. It is noted that, in the embodiments in which the first etch stop layer 17 and/or the first dielectric layer 16 are doped, the dopants in the first etch stop layer 17 and/or the first dielectric layer 16 are substantially the same as the dopants in the second dielectric layer 18b, and the doping concentration (s) of the first etch stop layer 17 and/or the first dielectric layer 16 are much less than the doping concentration of the second dielectric layer 18b.

In the present embodiment, the second etch stop layer 30 is formed after performing the doping process 101, and therefore the second etch stop layer 30 is undoped. The second etch stop layer 30 covers the top surfaces of the second dielectric layer 18b of the dielectric structure 19 and the contact structure 27. The second etch stop layer 30 is separated from the air gap 28a by the second portion P2 of the second dielectric layer 18b therebetween.

In some embodiments, the contact structure 27 includes the contact 26 and the contact spacer 23a on sidewalls of the contact 26. The contact spacer 23a is disposed laterally between the second dielectric layer 18b and the contact 26, and laterally between the air gap 28a and the contact 26. In such embodiment, the contact 26 is separated from the second dielectric layer 18b and the air gap 28a by the contact spacer 23a therebetween. In alternative embodiments, the contact spacer 23a is omitted. That is, the contact structure 27 includes the contact 26 without contact spacers 23 on sidewalls thereof. In such embodiments, the contact 26 would be in direct contact with the second dielectric layer 18b of the dielectric structure 19, and the sidewalls of the contact 26 partially define the air gap 28a.

Figure 5B:
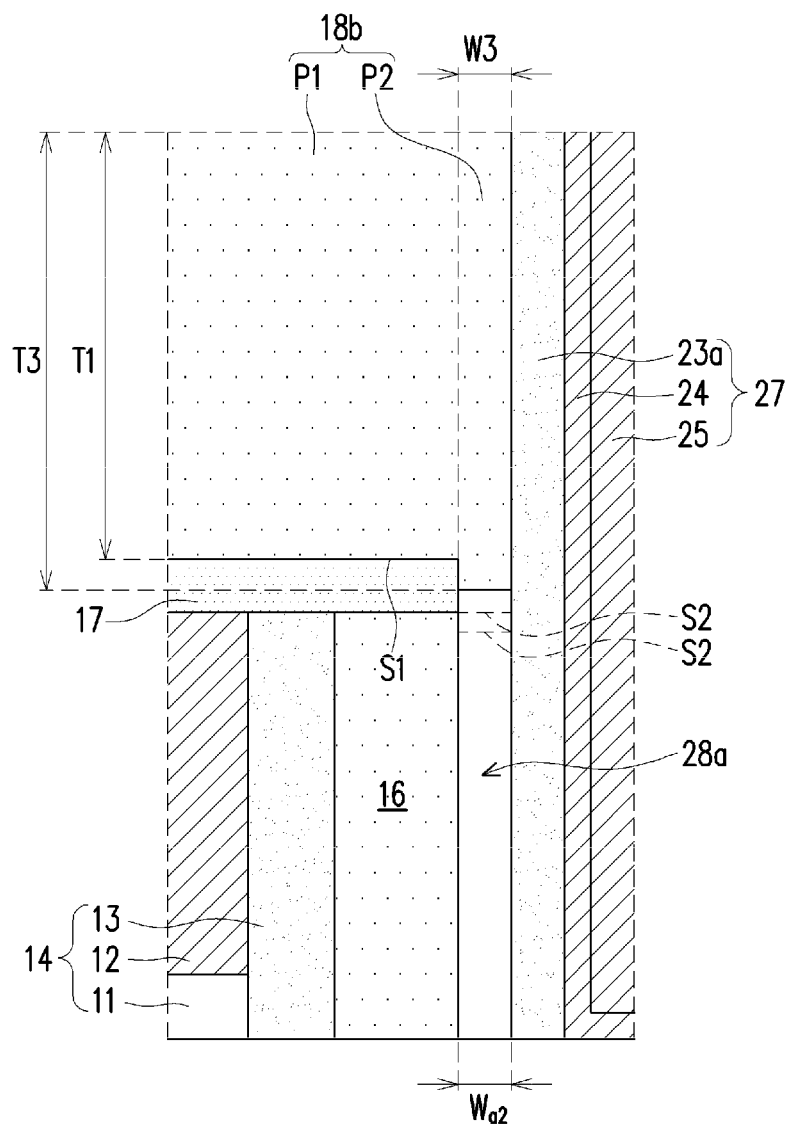
Figure 5C:
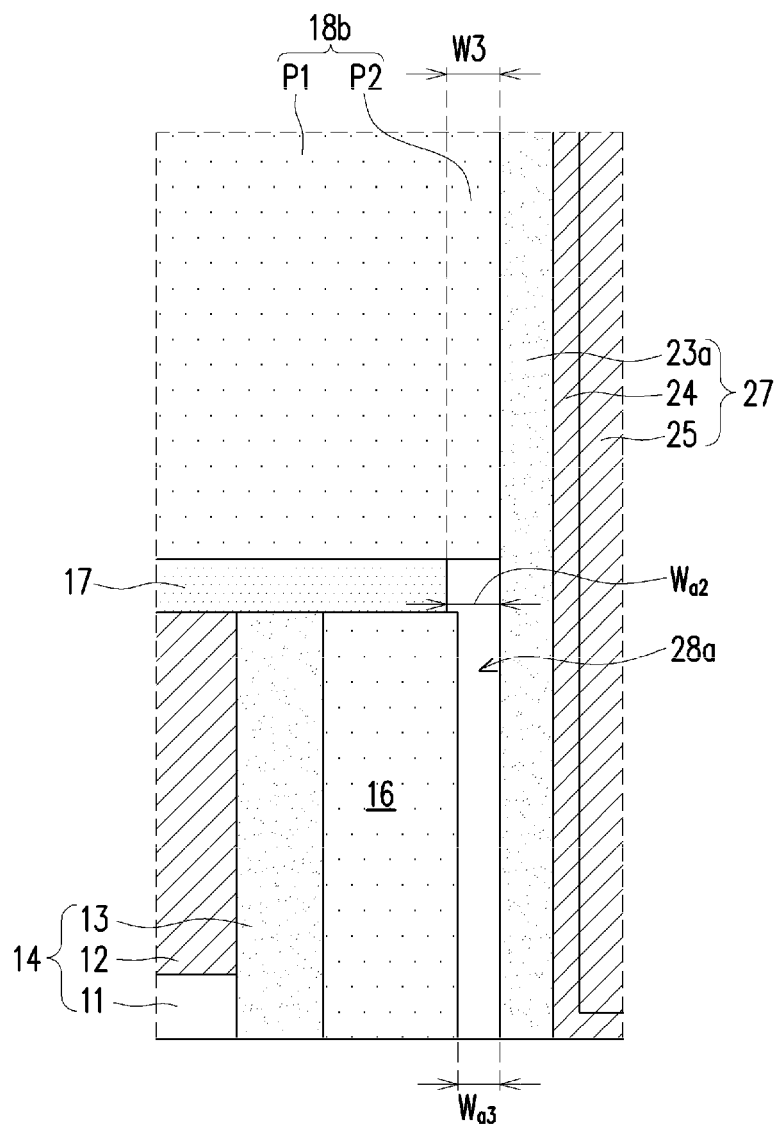

FIG. 5B and FIG. 5C illustrates enlarged cross-sectional views in the dashed area DA outlined in FIG. 1L according to some other embodiments of the disclosure.

Referring to FIG. 5B, in some embodiments, the second dielectric layer 18b may further extend downwardly to fill a portion of the air gap between the first etch stop layer 17 and the contact structure 27. The sidewalls of the first etch stop layer 17 may be partially or completely covered by and in contact with the second portion P2 of the dielectric layer 18b. The thickness T3 of the second portion P2 is larger than the thickness T1 of the first portion P1, and the bottom surface S2 of the second portion P2 is lower than the bottom surface S1 of the first portion P1, and may be higher than or substantially coplanar with (shown as the dashed line) the bottom surface of the first etch stop layer 17. In further embodiments, the second portion P2 may further extend to fill a very small portion of the air gap between the first dielectric layer 16 and the contact structure 27. In other words, a very small portion of the sidewalls of the first dielectric layer 16 may be covered by and in contact with the second portion P2 of the dielectric layer 18b, and the bottom surface S2 of the second portion P2 may be slightly lower than the bottom surface of the first etch stop layer 17 (shown as the dashed line).

FIG. 5C illustrates the embodiments in which the first dielectric layer 16 is doped and minor expanded. Referring to FIG. 5C, in some embodiments, the first dielectric layer 16 is expanded and laterally protruding from the sidewall of the first etch stop layer 17. In some embodiments, the air gap 28a is disposed between the first etch stop layer 17/the first dielectric layer 16 and the contact structure 27, and the air gap 28a has a non-uniform width from top to bottom. For example, the air gap 28a has a first width $W_{a2}$ defined by the first etch stop layer 17 and the contact structure 27, and a second width $W_{a3}$ defined by the first dielectric layer 16 and the contact structure 27. The second width $W_{a3}$ is less than the first width $W_{a2}$.

Figure 5D:
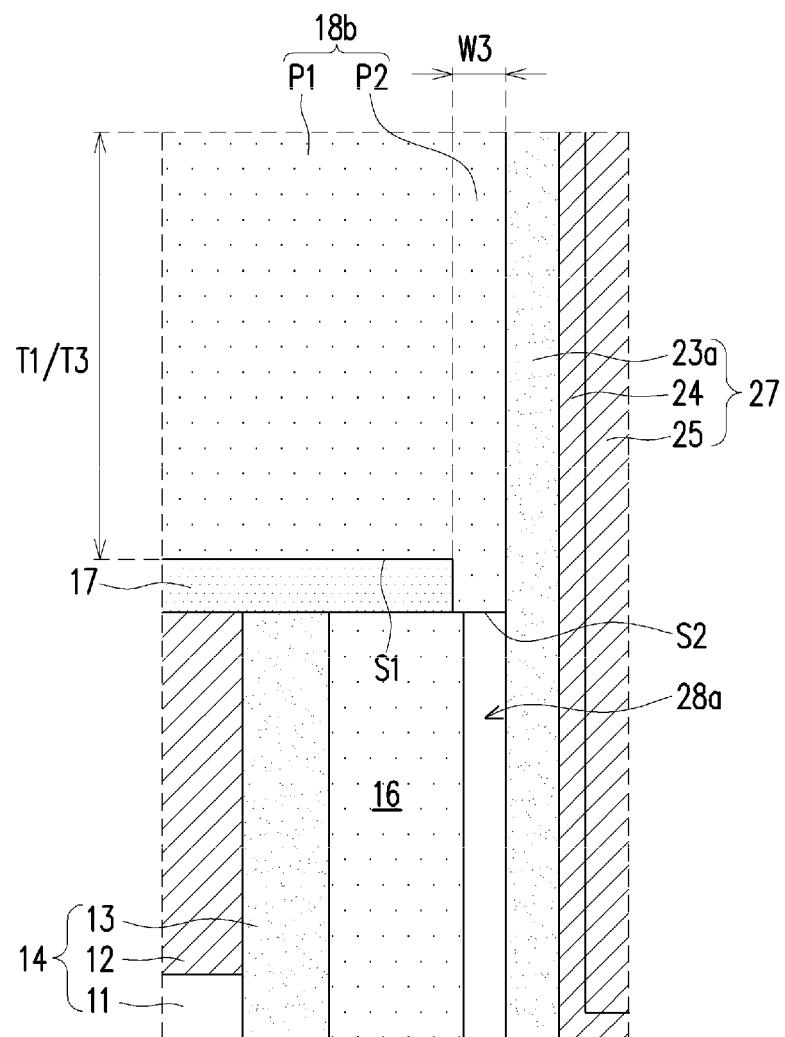

FIG. 5D illustrates the embodiments in which the first dielectric layer 16 is slightly expanded and the second portion P2 further extends downwardly. As shown in FIG. 5D, in some embodiments, the second portion P2 of the second dielectric layer 18b may extend to contact the expanded portion (extending portion) of the first dielectric layer 16.

Figure 2A:
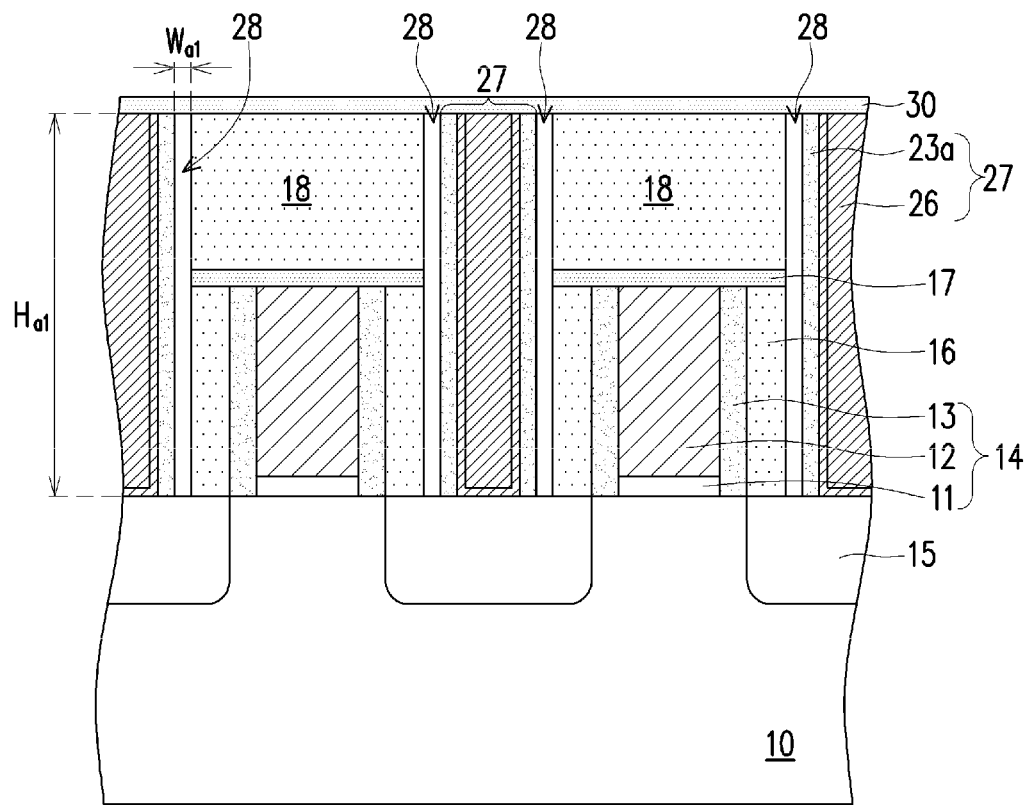
FIG. 2A to FIG. 2C are schematic cross-sectional views illustrating a method of forming a semiconductor device according to a second embodiment of the disclosure.
Figure 2B:
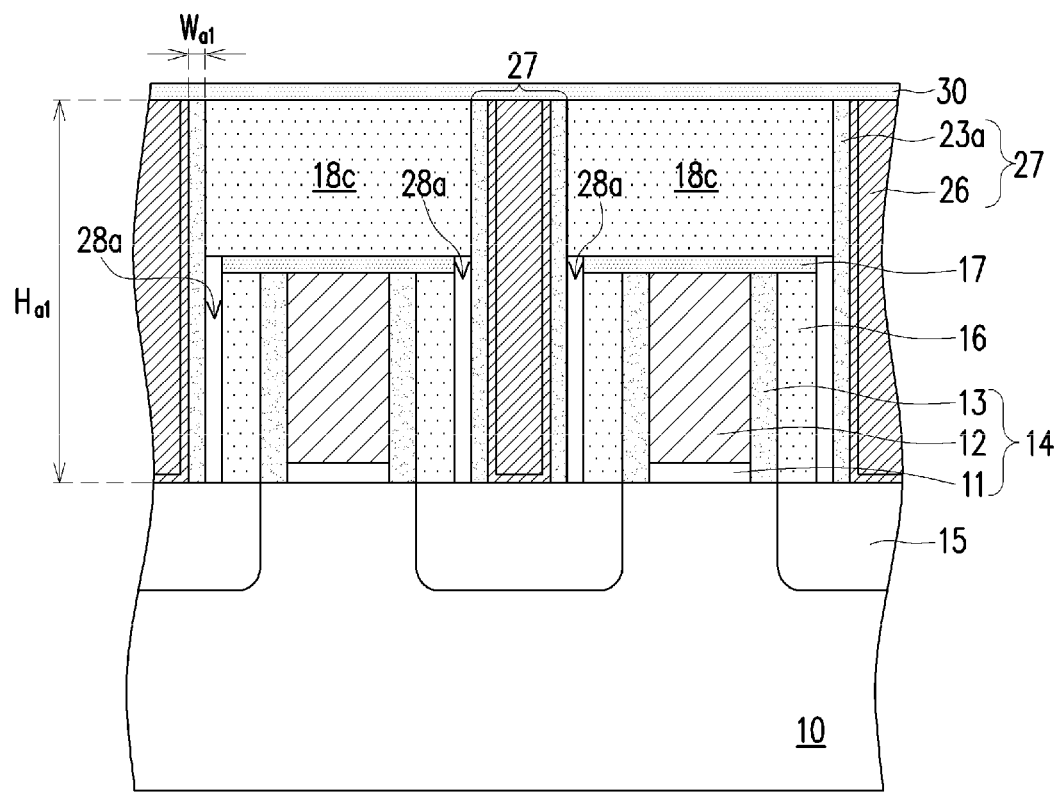
Figure 2C:
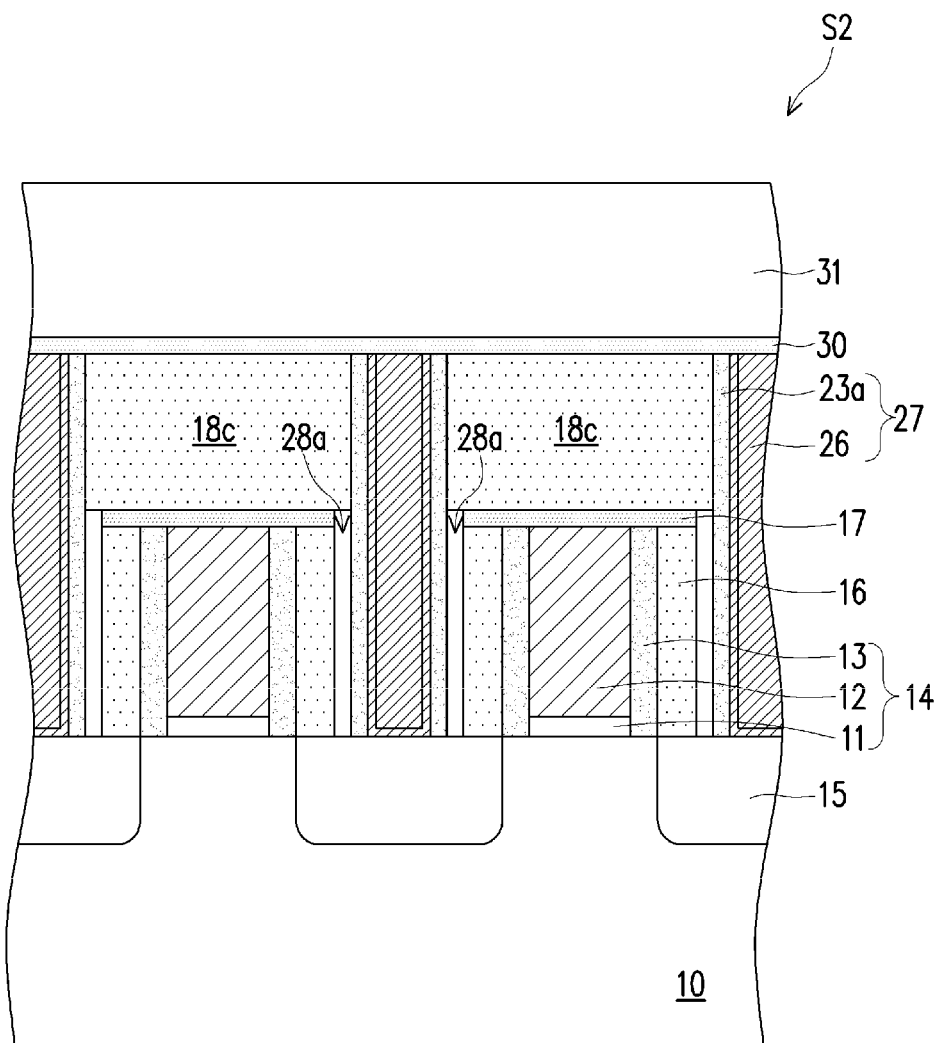

FIG. 2A to FIG. 2C are cross-sectional views illustrating a method of forming a semiconductor device according to a second embodiment of the disclosure. The second embodiment is similar to the first embodiment, except that the doping process 101 for expanding the second dielectric layer 18 is performed after forming the second etch stop layer 30. Like elements are designated with the same reference numbers for ease of understanding and the details thereof are not repeated herein.

Referring to FIG. 1I and FIG. 2A, in some embodiments, after the air gap 28 is formed as shown in FIG. 1I, the doping process is not immediately performed on the second dielectric layer 18. Instead, the second etch stop layer 30 is formed to cover the top surfaces of the second dielectric layer 18 and the contact structure 27 and across the air gaps 28. In some embodiments, the second etch stop layer 30 does not fill in the air gaps 28, substantially. Currently, the air gap 28 is laterally between the second dielectric layer 18 and the contact structure 27, between the first etch stop layer 17 and the contact structure 27, and between the first dielectric layer 16 and the contact structure 27, and the air gap 28 is covered by the second etch stop layer 30.

Referring to FIG. 2A and FIG. 2B, a sealing process is performed to fill the top of the air gap 28. In some embodiments, the sealing process includes a doping process. FIG. 6B schematically illustrates the doping process according to some embodiments of the disclosure.

Referring to FIG. 2A to FIG. 2B and FIG. 6B, after the second etch stop layer 30 is formed, a doping process 101 is performed to cause an expansion of the dielectric layer 18, so as to form an expanded dielectric layer 18c.

In the present embodiment, since the doping process 101 is performed after forming the second etch stop layer 30, and the dielectric layer 18 is covered by the second etch stop layer 30, the expansion of the dielectric layer 18 is also constrained by the second etch stop layer 30. The expansion mechanism of the dielectric layer 18 caused by the doping process 101 is similar to those described in the first embodiment, except the expansion of the dielectric layer 18 is further constrained by the second etch stop layer 30.

In other words, in the present embodiment, the expansion of the dielectric layer 18 in vertical direction is constrained by the first etch stop layer 17 and the second etch stop layer 30. In some embodiments, the dielectric layer 18 expands in lateral directions (e.g. directions +X, −X, +Y, −Y) until touching the contact structure 27 and does not expand in vertical directions (e.g. directions +Z, −Z). In some embodiments, when the dielectric layer 18 laterally expands and protrudes sidewalls of the first etch stop layer 17, the portion of the expanding dielectric layer 18 laterally protruding from the first etch stop layer 17 may further expand downwardly without being constrained by the first etch stop layer 17. In other words, the dielectric layer 18 does not expand in direction +Z, and an extending portion thereof may expand in direction −Z (not shown).

Referring to FIG. 2B, in some embodiments, the expanded dielectric layer 18c fills and seals the top of the air gap 28, and an air gap 28a is at least remained laterally between the first dielectric layer 16 and the contact structure 27. In some embodiments, the air gap 28a is also disposed laterally between the first etch stop layer 17 and the contact structure 27. In some embodiments, the expanded dielectric layer 18c, the first etch stop layer 17 and the first dielectric layer 16 are collectively referred to as the dielectric structure 19.

In the present embodiment, since the expansion of the dielectric layer 18 is constrained by the second etch stop layer 30, the dielectric layer 18 has no expanded portion protruding over the contact structure 27, the planarization process for removing the protruding portion of the expanded dielectric layer 18 over the contact structure 27 (as shown in FIG. 1J to FIG. 1K) is thus omitted. In some embodiments, since the doping process is performed after forming the second etch stop layer 30, the second etch stop layer 30 may also be doped by the doping process and includes dopants therein. The dopants in the second etch stop layer 30 may be substantially the same as the dopants in the second dielectric layer 18c, and the doping concentration of the second etch stop layer 30 may be smaller than, substantially equal to or larger than the doping concentration of the second dielectric layer 18c. In some embodiments, the dopants may also be found in the contact 26 and the contact spacer 23a of the contact structure 27. In other words, the contact structure 27 may include dopants the same as the dopants contained in the etch stop layer 30 and the dielectric layer 18c. The structural features of the dielectric layer 18c are substantially the same as those of the dielectric layer 18b described in the first embodiments, and the other structural features and position relations between the contact structure 27, the dielectric structure 19 and the air gap 28a are substantially the same as those described in the first embodiment, which are not repeated again here.

Referring to FIG. 2C, thereafter, the dielectric layer 31 is formed on the second etch stop layer 30, and a semiconductor structure S2 is thus formed. The semiconductor structure S2 is similar to the semiconductor structure S1, except that the forming process order is different.

Figure 3A:
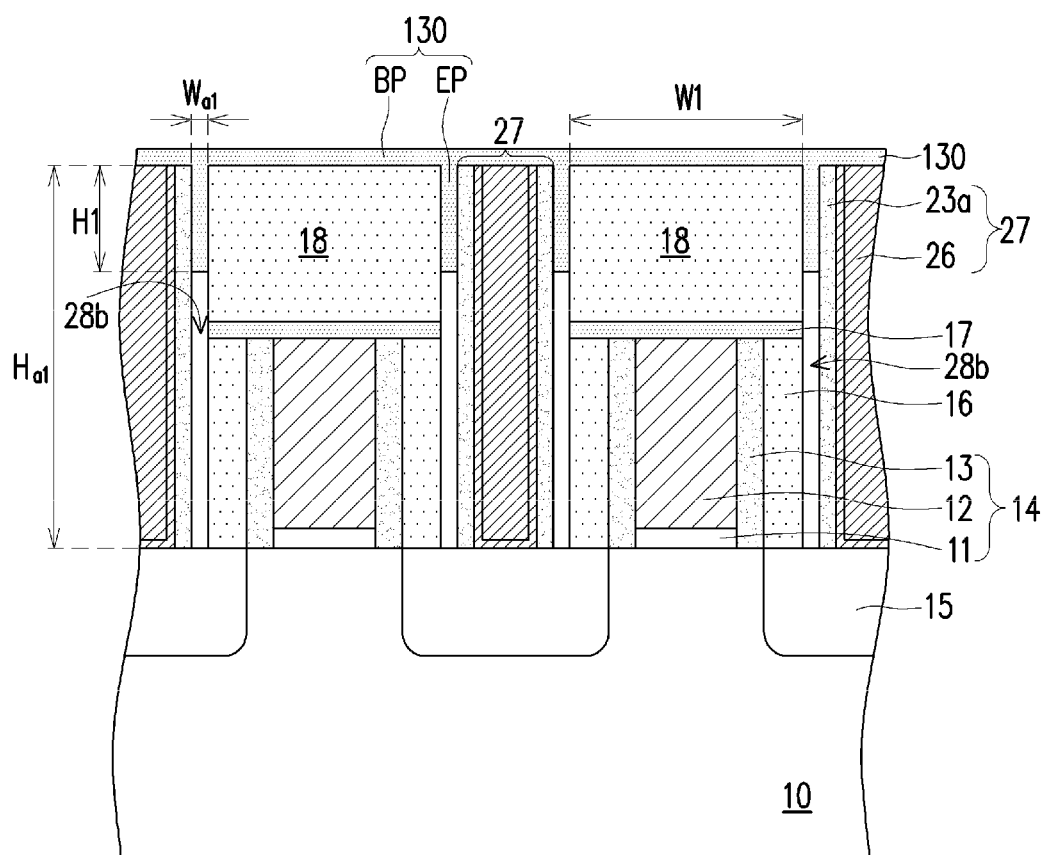
FIG. 3A to FIG. 3B are schematic cross-sectional views illustrating a method of forming a semiconductor device according to a third embodiment of the disclosure.
Figure 3B:
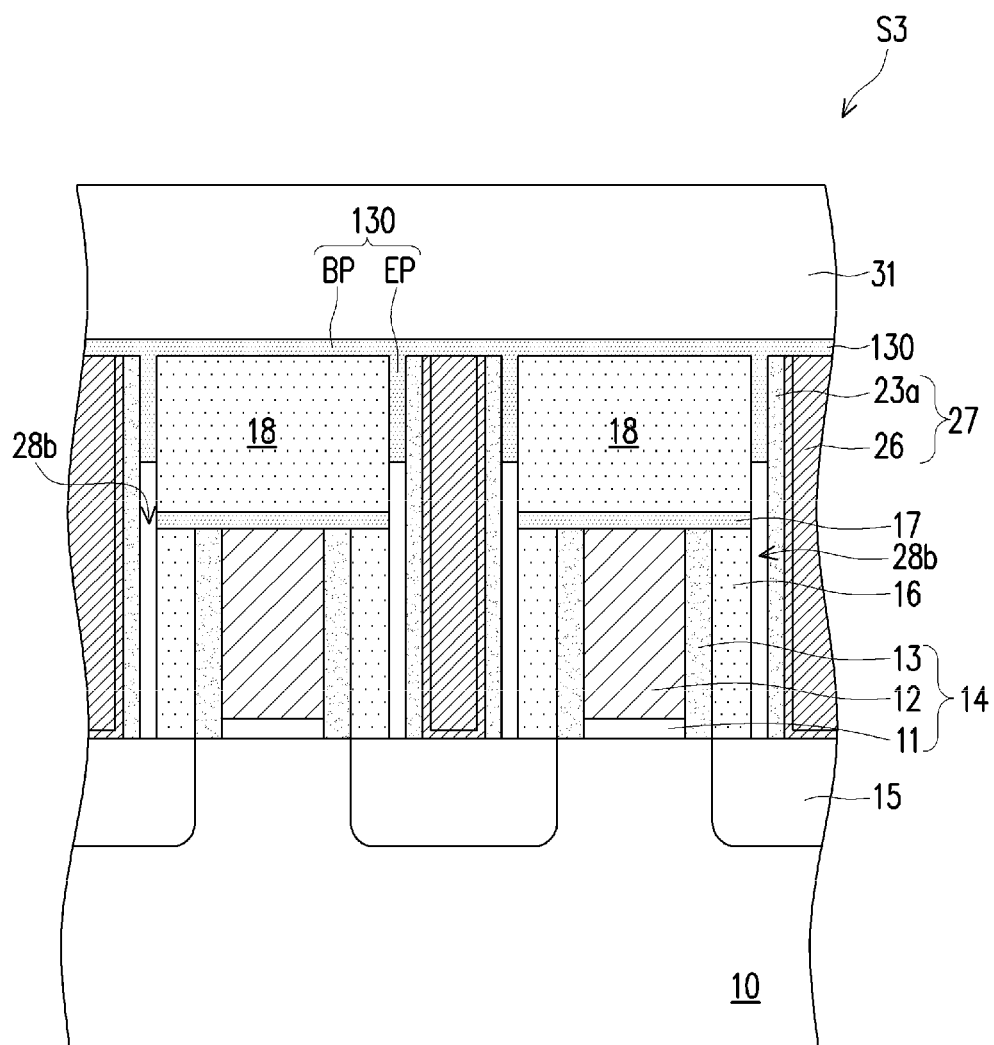

FIG. 3A to FIG. 3B are cross-sectional views illustrating a method of forming a semiconductor structure according to a third embodiment of the disclosure. The third embodiment differs from the foregoing embodiment in that the sealing the top of the air gap 28 is implemented by extending the second etch stop layer 30 into the air gap 28.

Referring to FIG. 1I and FIG. 3A, in some embodiments, after the air gap 28 is formed as shown in FIG. 1I, a second etch stop layer 130 is formed on the second dielectric layer 18 and the contact structure 27. In some embodiments, the second etch stop layer 130 is formed by a suitable deposition process, and the deposition process parameter is controlled, such that the second etch stop layer 130 can partially fill into the air gap 28. For example, the second etch stop layer 130 may be formed by CVD, PECVD, ALD, and the deposition rate is controlled to be very slow.

In some embodiments, the etch stop layer 130 extends to fill an upper portion of the air gap 28 (FIG. 1I), and does not fully fill the air gap 28, and an air gap 28b is remained. In some embodiments, the etch stop layer 120 may partially or completely fills the portion of the air gap 28 laterally between the second dielectric layer 18 and the contact structure 27. In some embodiments, the etch stop layer 120 may further extend to fill the portion of the air gap 28 laterally between the first etch stop layer 17 and the contact structure 27. In some embodiments, the etch stop layer 120 does not extend to fill the portion of the air gap 28 between the first dielectric layer 16 and the contact structure 27, substantially. In some other embodiments, the etch stop layer 120 may further extend to fill a very small portion of the air gap 28 between the first dielectric layer 16 and the contact structure 27.

Still referring to FIG. 3A, the second etch stop layer 130 includes a body portion BP and an extending portion EP. The body portion BP covers the top surfaces of the second dielectric layer 18 and the contact structure 27. The extending portion EP extends from the bottom surface of the body portion BP and fills a portion of the air gap 28. In other words, the extending portion EP serves a sealing material sealing the top of the air gap 28.

In some embodiments, the extending portion EP is disposed laterally between and in contact with sidewalls of the second dielectric layer 18 and the contact structure 27. The bottom surface of the extending portion EP may be higher than the bottom surface of the second dielectric layer 18, but the disclosure is not limited thereto. In alternative embodiments, the bottom surface of the extending portion EP may be substantially coplanar with the bottom surface of the second dielectric layer 18. In yet another embodiment, the extending portion EP may further extend to be laterally between and in contact with the first etch stop layer 17 and the contact structure 27, and the bottom surface of the extending portion EP may be at a level height lower than the bottom surface of the second dielectric layer 18 and may be higher than or substantially coplanar with the bottom surface of the first etch stop layer 17. In some embodiments, the extending portion EP is not in contact with the first dielectric layer 16. In some other embodiments, the extending portion EP may extend to have a bottom surface slightly lower than the bottom surface of the first etch top layer 17, and therefore contact a very small portion of the first dielectric layer 16.

In other words, the air gap 28b is at least disposed laterally between the first dielectric layer 16 and the contact structure 27. In alternative embodiments, the air gap 28b is disposed laterally between the first dielectric layer 16 and the contact structure 27, and laterally between the first etch stop layer 17 and the contact structure 27. In yet another embodiment, the air gap 28 may be disposed laterally between the first dielectric layer 16 and the contact structure 27, laterally between the first etch stop layer 17 and the contact structure 27, and laterally between a portion of the second dielectric layer 18 and the contact structure 27.

In some embodiments, the ratio (H1: $H_{a1}$) of the height H1 of the extending portion EP to the height $H_{a1}$ of the air gap 28 (FIG. 1I) range from 0 to 1 (excluding 0 and 1), such as 1/3, for example. In other words, the extending portion EP may fill a portion of the air gap 28, the height H1 of the extending portion EP is not limited, as long as at least the top of the air gap 28 is filled by the extending portion EP, and air gap 28a is remained between the contact structure 27 and the adjacent ILD(s).

Referring to FIG. 3B, thereafter, the dielectric layer 31 is formed to cover the second etch stop layer 130, and a semiconductor device S3 is thus formed. The third embodiment differs from the foregoing embodiments in that, the extending portion EP of the second etch stop layer 130 serves as the sealing material, and the second dielectric layer 18, the first etch stop layer 17 and the first dielectric layer 16 of the dielectric structure 19 are not doped.

Figure 4:
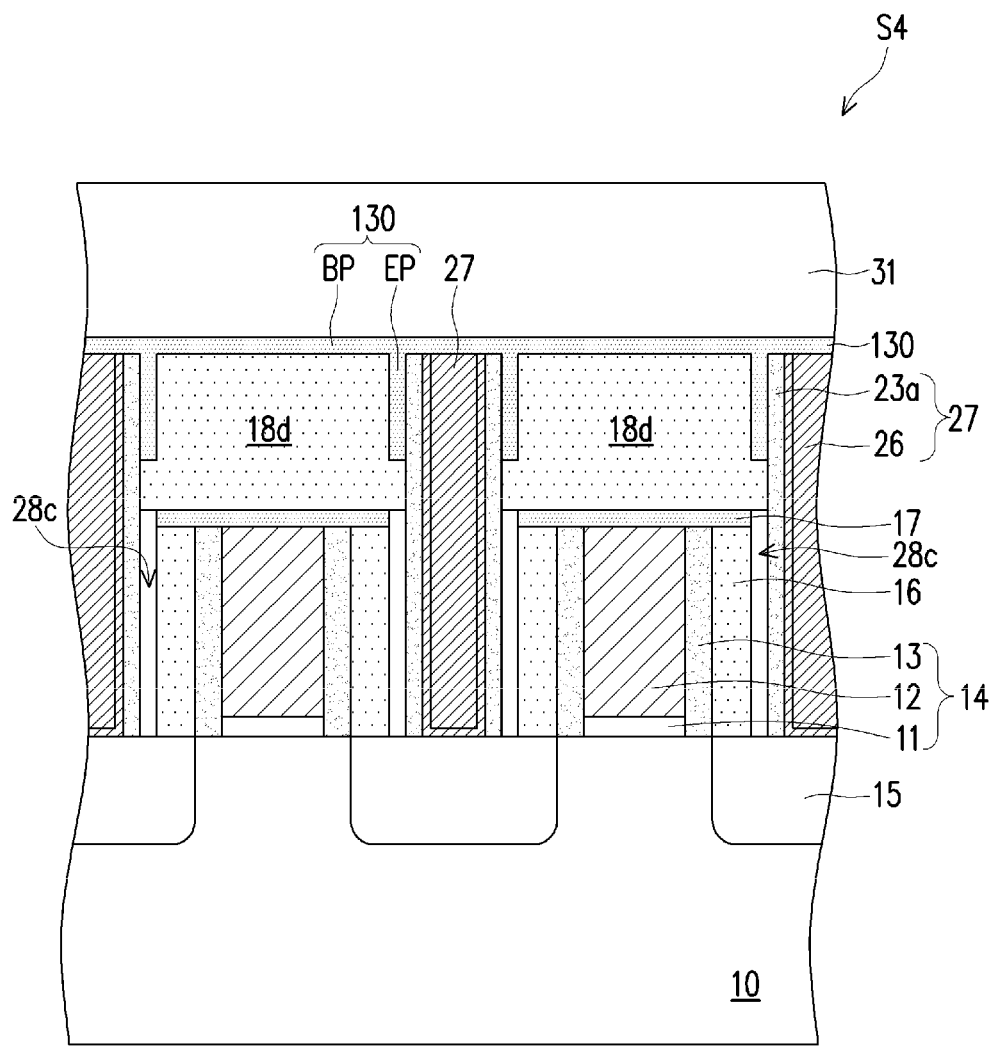
FIG. 4 is a schematic cross-sectional view illustrating a semiconductor device according to some embodiments of the disclosure.

FIG. 4 is a cross-sectional view illustrating a semiconductor device according to a fourth embodiment of the disclosure. The fourth embodiment is similar to the third embodiment, except that a doping process is further performed after forming the second etch stop layer 130, and the second dielectric layer is further doped and expanded.

Referring to FIG. 3A and FIG. 4, in some embodiments, the second etch stop layer 130 is formed to fill a portion of the air gap 18 between the second dielectric layer 18 and the contact structure 27. That is, an upper portion of the second dielectric layer 18 is in contact with the extending portion EP of the second etch stop layer 130, while a lower portion of the second dielectric layer 18 is not in contact with the extending portion EP, and is laterally separated from the contact structure 27 by the air gap 28b therebetween. Thereafter, the doping process (such as the doping process 101 shown in FIG. 6B) is further performed on the second dielectric layer 18 to cause an expansion of the second dielectric layer 18, and an expanded second dielectric layer 18d is formed to fill a portion of the air gap 28b (FIG. 3B), and an air gap 28c is remained at least laterally between the first dielectric layer 16 and the contact structure 27. In the present embodiment, the expansion of the second dielectric layer 18 is constrained by the first etch stop layer 17 and the second etch stop layer 130.

In some embodiments, the expansion of the upper portion of the second dielectric layer 18 in upward direction and lateral directions is constrained by the second etch stop layer 130. The lower portion of the second dielectric layer 18 is expanded to be in contact with the contact structure 27. As such, the expanded dielectric layer 18b has an upper portion and a lower portion with different widths, wherein the lower portion is wider than upper portion. The upper portion of the expanded dielectric layer 18b is in contact with the extending portion EP of the second etch stop layer 130 and separated from the contact structure 27 by the extending portion EP of the second etch stop layer 130 therebetween. The lower portion of the expanded dielectric layer 18b laterally protrudes from sidewalls of its upper portion and the sidewalls of the first etch stop layer 17, so as to be in contact with the sidewalls of the contact structure 27, and the top surface of the lower portion of the expanded dielectric layer 18b is covered by and in contact with the bottom surface of the extending portion EP of the second etch stop layer 130. In such embodiments, the extending portion EP of the second etch stop layer 130 and the expanded portion of the second dielectric layer 18d together serve as the sealing material for sealing the top of the air gap.

Figure 7:
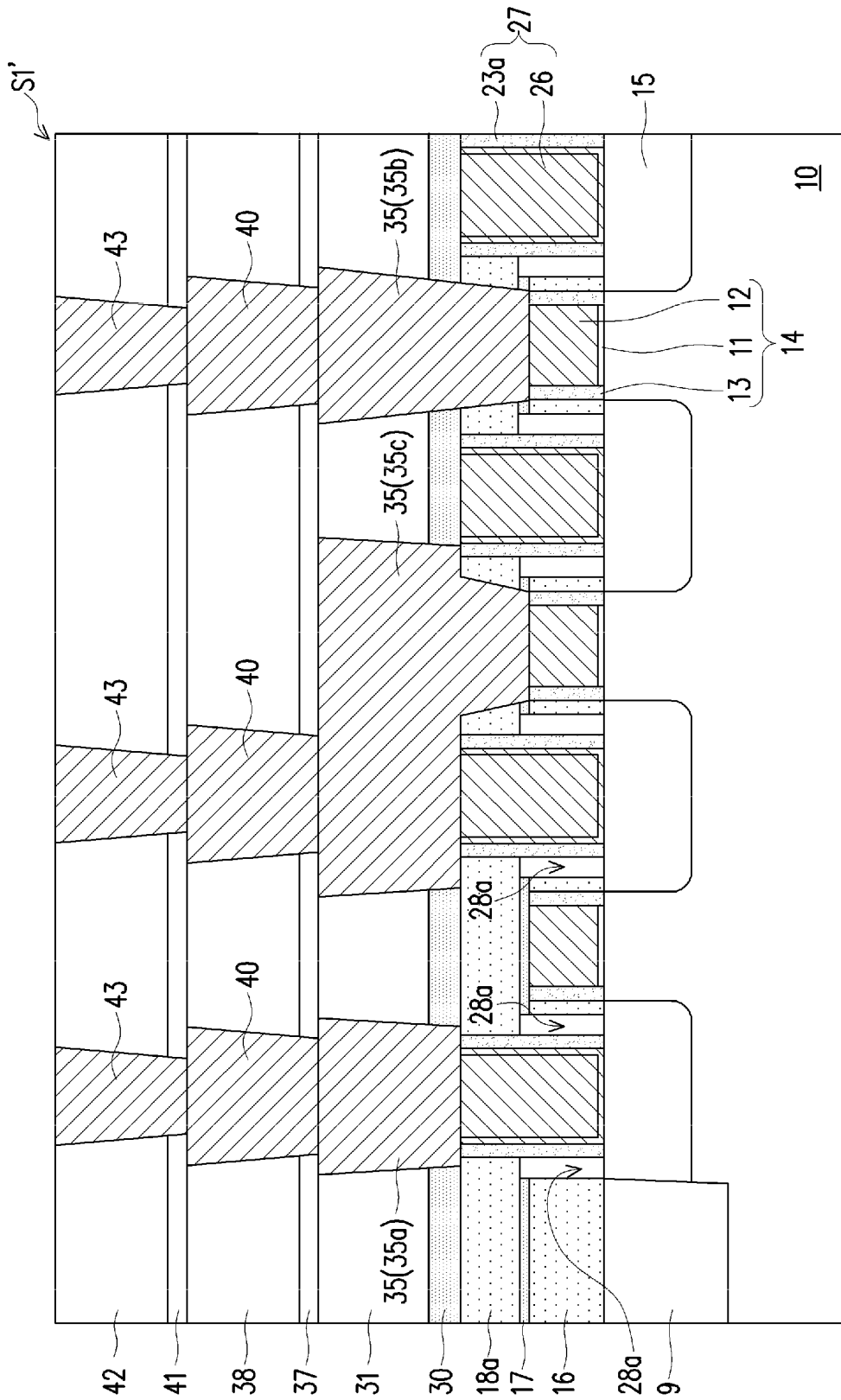
FIG. 7 is a schematic cross-sectional view illustrating a semiconductor device according to some embodiments of the disclosure.

FIG. 7 illustrates a semiconductor device S1' showing more details and overlying interconnect features of the semiconductor device S1. Like elements are designated with the same reference numbers for ease of understanding and the details thereof are not repeated herein.

Referring to FIG. 7, an isolation structure 9 is shown in the substrate 10. The isolation structure 9 is laterally aside the S/D regions 15. In some embodiments, the isolation structure 9 is a STI structure. In some embodiments, after the foregoing semiconductor device (e.g. the semiconductor device S1) is formed, a plurality of via plugs 35 (e.g. 35a and 35c) are formed to penetrate through the dielectric layer 31 and the second etch stop layer 30 to electrically connect to the contact structure 27. Some of the via plugs 35 (e.g. 35b and 35c) further penetrates through the dielectric layer 18a and the etch stop layer 17. In some embodiments, the via plug 35 includes a barrier layer and a conductor on the barrier layer. The material of the via plug 35 is similar to, and may be the same as or different from that of the contact 26. The top surfaces of the via plugs 35 may be substantially coplanar with the top surface of the dielectric layer 31. In some embodiments, the via plugs 35 include via plug 35a, 35b and 35c. The via plug 35a is electrically connected to the contact 26 of the contact structure 27, the via plug 35b is electrically connected to the gate electrode 12 of the gate structure 14, and may also be referred to as a gate contact. In some embodiments, the via plug 35c is formed to connect to both of the contact 26 and the gate electrode 12.

In some embodiments, the via plugs 35 may be formed by the following processes: after the second etch stop layer 30 and the dielectric layer 31 are formed, a patterning process is performed to remove portions of the dielectric layer 31 and the second etch stop layer 30 to form via holes exposing the contact structure 27 and/or the gate structure 14. The patterning process may include photolithograph and etching processes. Thereafter, barrier material and metallic material are formed to fill in the via holes to be electrically connected to the contact 26 of the contact structure 27 and the gate electrode 12 of the gate structure 14.

In some embodiments, portions of the via plugs 35 are overlapped with the air gap 28a in a direction perpendicular to the top surface of the substrate 10. In the embodiments of the disclosure, since the top of the air gap 28a has been sealed by the sealing material (e.g. the expanded dielectric layer 18a, and/or the extending portion of the second etch stop layer 130), and the second etch stop layer 30 (or the horizontal portions of the second etch stop layer 130 shown in FIG. 3B/4) is separated from the air gap (e.g. 28a/28b/28c) by the sealing material therebetween, some issues are avoided. For example, if the sealing process is not performed to seal the top of the air gap 28 (FIG. 1I), the via plug 35 (especially the via plugs 35a/35c connected to the contact 26) may land on the air gap, which may result in undesirable dielectric or etch byproduct or metal refill in the air gap. In the embodiments of the disclosure, since the top of the air gap has been sealed by the sealing material, the above-described issue, that is, the undesirable refill of the air gap is avoided during the formation of the via plugs 35.

In some embodiments, after the via plugs 35 are formed, the etch stop layer 37 and the dielectric layer 38 are sequentially formed, and the conductive lines 40 are formed to penetrate through the dielectric layer 38 and the etch stop layer 37 to connect to the via plugs 35. The top surfaces of the conductive lines 40 may be substantially coplanar with the top surface of the dielectric layer 38. Afterwards, the etch stop layer 41 and the dielectric layer 42 are sequentially formed, and the vias 43 are formed to penetrate through the dielectric layer 42 and the etch stop layer 41 to connect to the conductive lines 40. In some embodiments, the top surfaces of the vias 43 are substantially coplanar with the top surface of the dielectric layer 42. Thereafter, more dielectric features and conductive features may be formed over the dielectric layer 42 and the vias 43 to form interconnect structure.

FIG. 8, FIG. 9A to FIG. 9D, and FIG. 10A to FIG. 10D are schematic cross-sectional views of intermediate stages for forming semiconductor device according to a fourth embodiment of the disclosure, the fourth embodiment is similar to the foregoing embodiments, except that the etch stop layer between ILDs is omitted, and the expansion of the ILDs is not constrained by etch stop layer. Like elements are designated with the same reference numbers for ease of understanding and the details thereof are not repeated herein.

Figure 8:
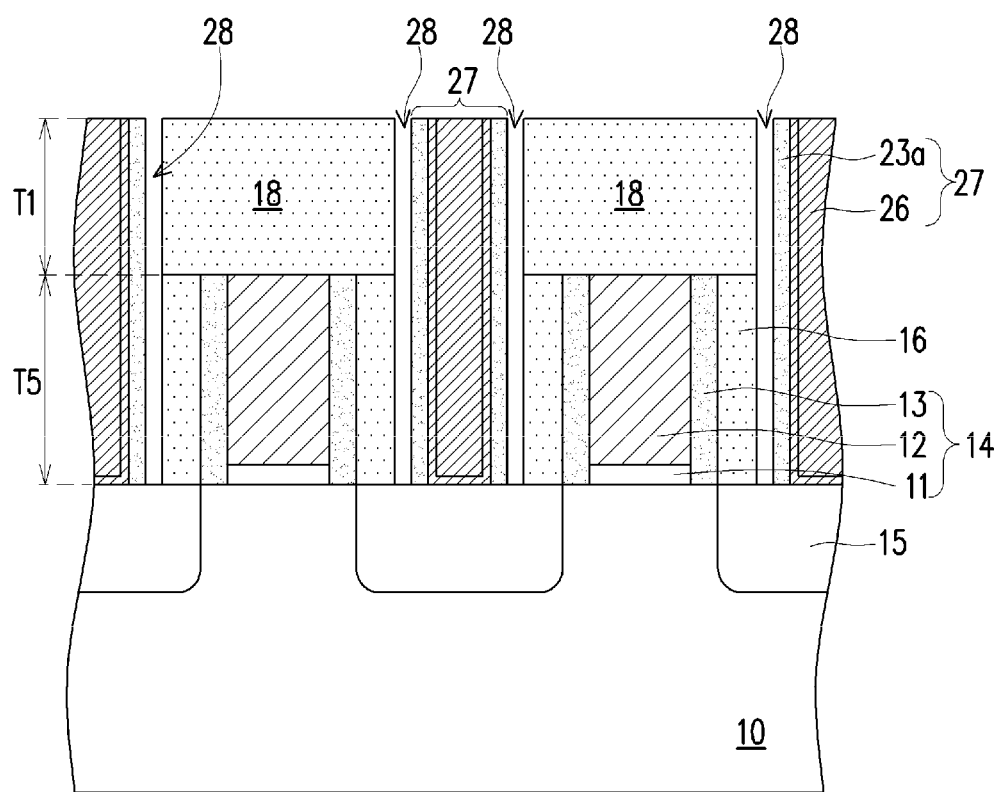
FIG. 8, FIG. 9A to FIG. 9D, and FIG. 10A to FIG. 10D are schematic cross-sectional views illustrating a method of forming semiconductor device according to a fourth embodiment of the disclosure.

Referring to FIG. 8, a structure in an intermediate stage for forming a semiconductor device is illustrated, the structure shown in FIG. 8 is similar to the structure shown in FIG. 1I, except that the etch stop layer 17 is omitted. The structure shown in FIG. 8 may be formed by processes similar to those described in FIG. 1A to FIG. 1I, except that the formation of the etch stop layer 17 is omitted.

As shown in FIG. 8, in some embodiments, the second dielectric layer 18 is directly formed on the first dielectric layer 16 and the gate structure 14. In other words, the second dielectric layer 18 is in direct contact with the first dielectric layer 16 and the gate structure 14 without an etch stop layer formed therebetween. In such embodiment, the air gap 28 is formed laterally between the contact structure 27 and the ILDs 16/18.

Referring to FIG. 8 and FIG. 9A to FIG. 9D, thereafter, a sealing process similar to those described in FIG. 1J and FIG. 6A is performed to seal the top of the air gap 28, and an air gap 28a is remained. For example, similar to the first embodiment, the sealing process includes performing a doping process 101 on the dielectric layer 18. In the present embodiment, since the formation of etch stop layer is omitted, the expansion of the dielectric layer 18 is not constrained by etch stop layer. In some embodiments, the doping process 101 includes a gradient doping process, and the ILD(s) may have a gradient doping concentration. In some embodiments, the doping process 101 is accurately controlled such that the first ILD 16 is not doped or at least the bottom of the first ILD 16 is not doped, so as to ensure the air gap 28 is not fully filled by the expanded ILD while sealing the air gap 28. For example, the energy of the doping process 101 may range from 2 keV to 80 keV, and the dosage of the doping process 101 may range from 1E13 atom/cm² to 1E17 atom/cm². In some embodiments, the thickness of the expanded dielectric layer 18a after the doping process 101 may be 1 to 1.5 times (greater than 1) the thickness T1 of the second ILD 18 prior to the doping process 101. In some embodiments, the thickness of the dielectric layer 16/16a after the doping process 101 may be 1 to 1.5 times the thickness T5 of the first ILD 16 prior to the doping process 101. It is noted that, the above-described thickness ranges of ILDs 16/18 and parameter of the doping process 101 are merely for illustration, and the disclosure is not limited thereto. The parameter range of the doping process 101 is dependent on the thicknesses of the ILDs 16 and 18, and may be adjusted according to product design and requirement. Depending on the doping energy and dosage of the doping process 101, the ILDs 16 and 18 may have different profiles, which are described in detail below.

Figure 9A:
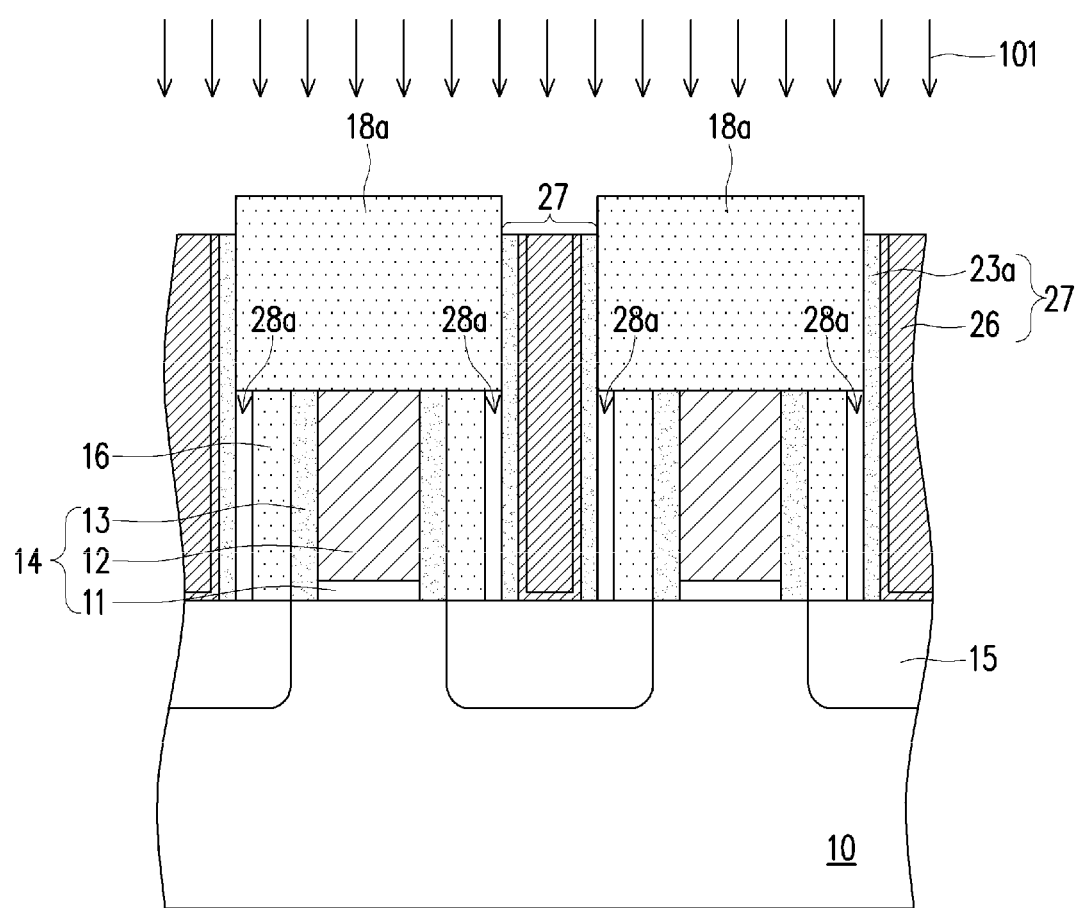

Referring to FIG. 8 and FIG. 9A, in some embodiments, the doping process 101 is accurately controlled, such that substantially entire dielectric layer 18 is doped and expanded to seal the top of the air gap 28, and an expanded dielectric layer 18a is formed, while the dielectric layer 16 is substantially not doped and does not expand. In some embodiments, the dielectric layer 18a has a gradient doping concentration. As a result, an air gap 28a is remained laterally between the dielectric layer 16 and the contact structure 27. In such embodiment, the expanded dielectric layer 18a contains dopants therein, while the dielectric layer 16 is free of dopant.

Figure 9B:
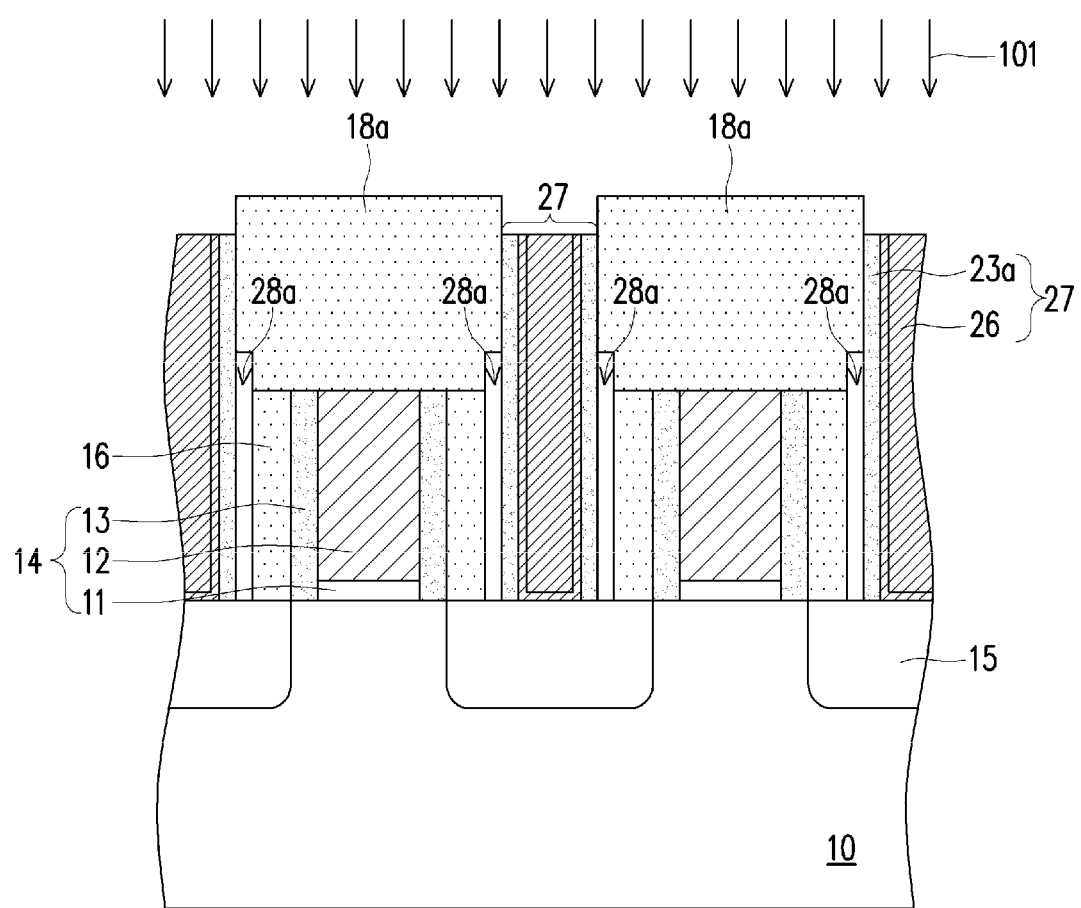

Referring to FIG. 8 and FIG. 9B, in some embodiments, through adjusting the doping energy and dosage of the doping process 101 (such as, less than those of the doping process 101 in FIG. 9A), the dielectric layer 18 may be partially doped, and the dielectric layer 16 is not doped. For example, the upper portion of the dielectric layer 18 is doped and expanded to seal the top of the air gap 28, while the lower portion of the dielectric layer 18 is not doped and does not expand. In such embodiment, an expanded dielectric layer 18a having non-uniform width is formed, and the air gap 28a is remained laterally between the dielectric layer 16 and the contact structure 27, and laterally between the lower portion of the dielectric layer 18a and the contact structure 27. In some embodiments, the cross-sectional shape of the dielectric layer 18a is T-shaped. That is, the upper portion of the dielectric layer 18a is wider than the lower portion of the dielectric layer 18a. In such embodiment, the upper portion of the dielectric layer 18a contains dopants therein, while the bottom of the dielectric layer 18a and the dielectric layer 16 are free of dopant.

Figure 9C:
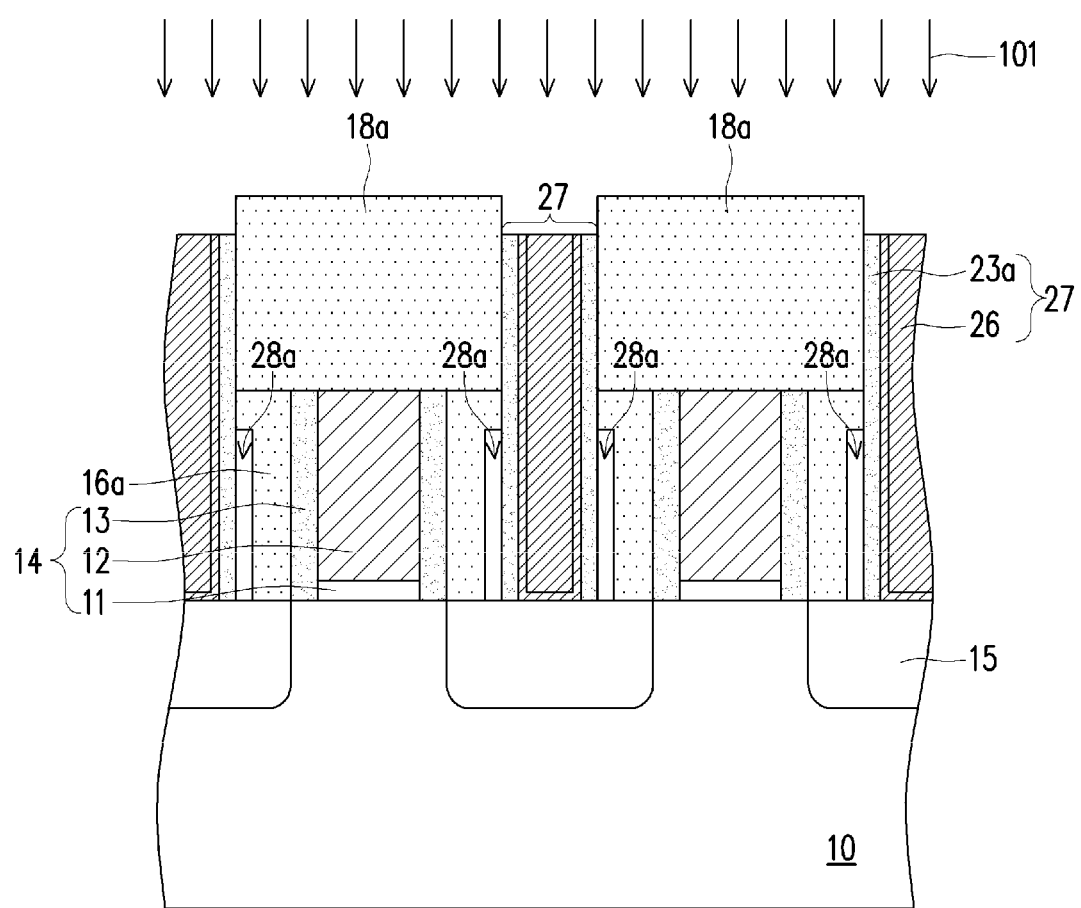

Referring to FIG. 8 and FIG. 9C, in some embodiments, the doping energy and dosage of the doping process 101 may be relatively larger than those described in FIG. 9A and FIG. 9B, such that the dielectric layer 18 and a portion of the underlying dielectric layer 16 are doped. For example, the dielectric layer 18 and the top of the dielectric layer 16 are doped and expanded, and an expanded dielectric layer 18a and a dielectric layer 16a are formed to seal the air gap 28. The dielectric layer 18a and the top of the dielectric layer 16a include dopants therein and are in contact with the sidewalls of the contact structure 27, while the lower portion of the dielectric layer 16a is free of dopant. In such embodiment, an air gap 28a is remained laterally between the bottom and/or middle portion of the dielectric layer 16a and the contact structure 27. The air gap 28a is sealed by the top of the dielectric layer 16a and the dielectric layer 18a.

Figure 9D:
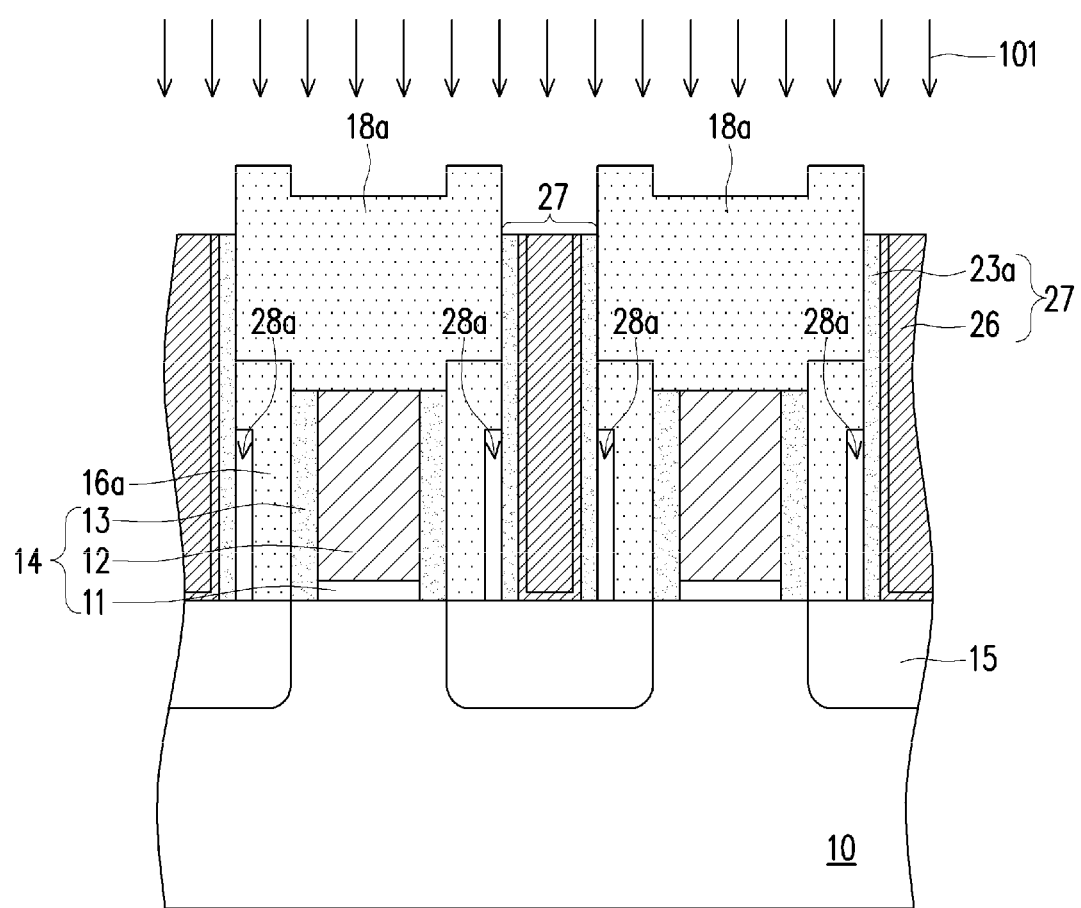

Referring to FIG. 8 and FIG. 9D, in some embodiments in which the dielectric layer 18 and the top of the dielectric layer 16 are doped, both of the dielectric layer 18 and the dielectric layer 16 may expand in horizontal directions and vertical direction, and the thicknesses of the dielectric layer 16 and the dielectric layer 18 may increase after expansion. In some embodiments, the dielectric layer 16 may expand upwardly and push the overlying dielectric layer 18 upward. As such, the interface between the expanded dielectric layer 18a and the dielectric layer 16a may be at a level height higher than the interface between the dielectric layer 18 and the dielectric layer 16. In some embodiments, the expanded dielectric layer 18a may have an uneven top surface and may include protrusions directly over the dielectric layer 16a.

Referring to FIG. 10A to FIG. 10D, thereafter, subsequent processes similar to those described in 1K and FIG. 1L are performed. For example, a planarization process is performed to remove excess portions of the dielectric layer 18a over the top surface of the contact structure 27, and a dielectric layer 18b is formed. The top surface of the dielectric layer 18b may be substantially coplanar with the top surface of the contact structure 27. The etch stop layer 30 may be optionally formed on the contact structure 27 and the dielectric layer 18b, and a dielectric layer 31 is formed on the etch stop layer 30. As such, semiconductor devices S5-S8 are thus formed. Due to the different parameters of the doping process 101 described in FIG. 9A to FIG. 9D, corresponding semiconductor devices S5-S8 illustrated in FIG. 10A to FIG. 10D have different structures.

Figure 10A:
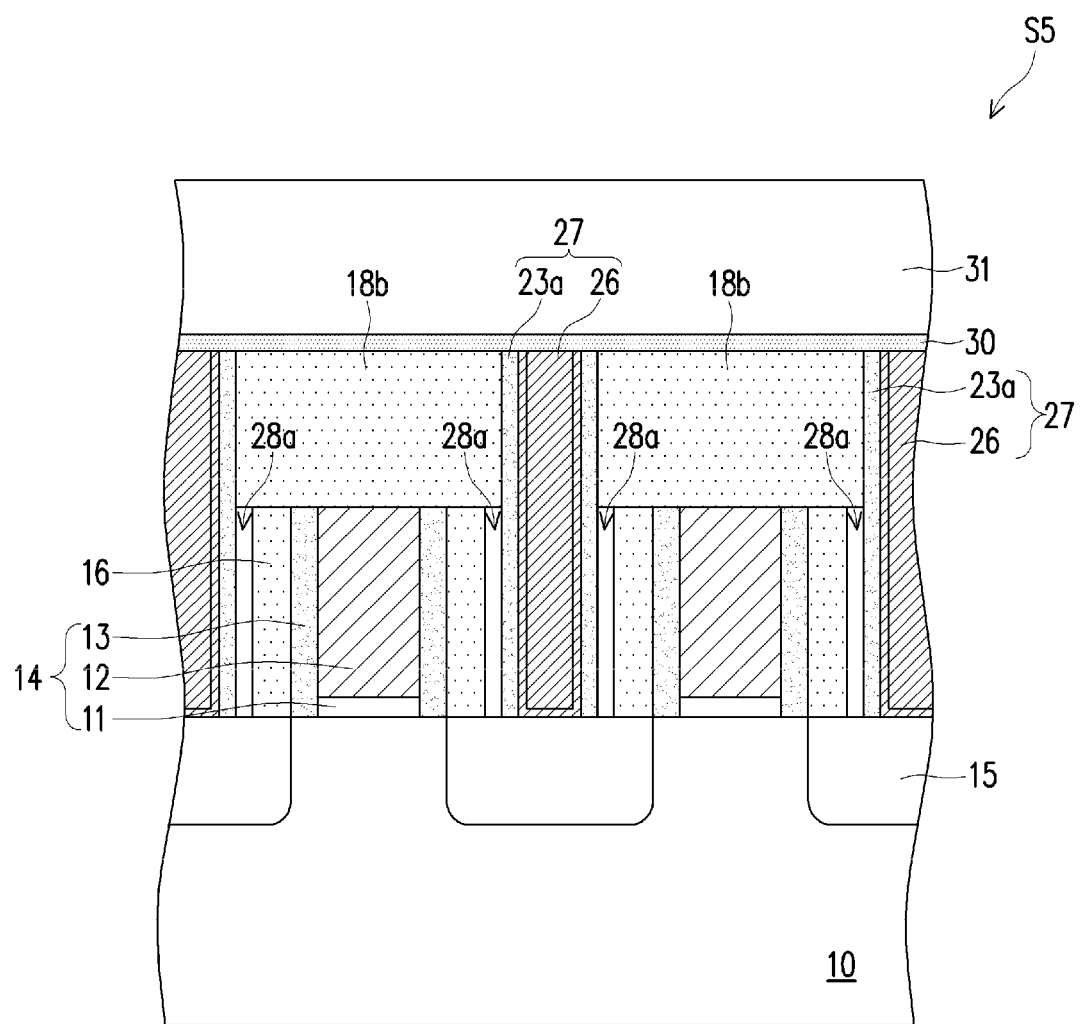

Referring to FIG. 9A and FIG. 10A, after performing the planarization process and forming the etch stop layer 30 and dielectric layer 31, the semiconductor device S5 is formed. In the semiconductor device S5, the air gap 28a is defined by the dielectric layer 16, the contact structure 27, the dielectric layer 18b and the substrate 10. The air gap 28a is laterally between the dielectric layer 16 and the contact structure 27. The dielectric layer 18b overlays the air gap 28a and is in contact with sidewalls of the contact structure 27. Dopants are included in the dielectric layer 18b and the contact structure 27.

Figure 10B:
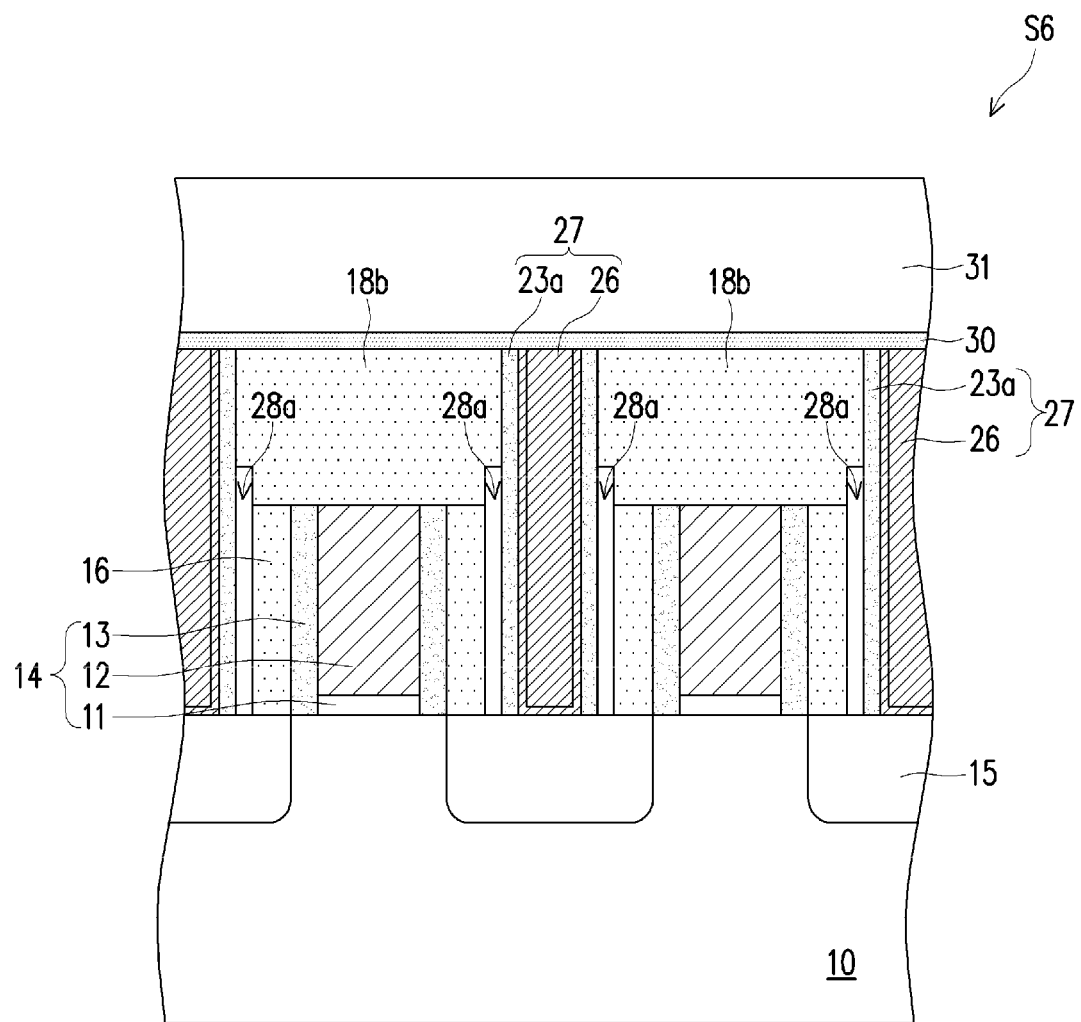

Referring to FIG. 9B and FIG. 10B, after performing the planarization process and forming the etch stop layer 30 and dielectric layer 31, the semiconductor device S6 is formed. In the semiconductor device S6, the air gap 28a is defined by the dielectric layer 16, the contact structure 27, the dielectric layer 18b and the substrate 10. In some embodiments, the air gap 28a is laterally between the dielectric layer 16 and the contact structure 27, and laterally between the lower portion of the dielectric layer 18b and the contact structure 27, the upper portion of the dielectric layer 18b overlays the air gap 28a and is in contact with sidewalls of the contact structure 27.

Figure 10C:
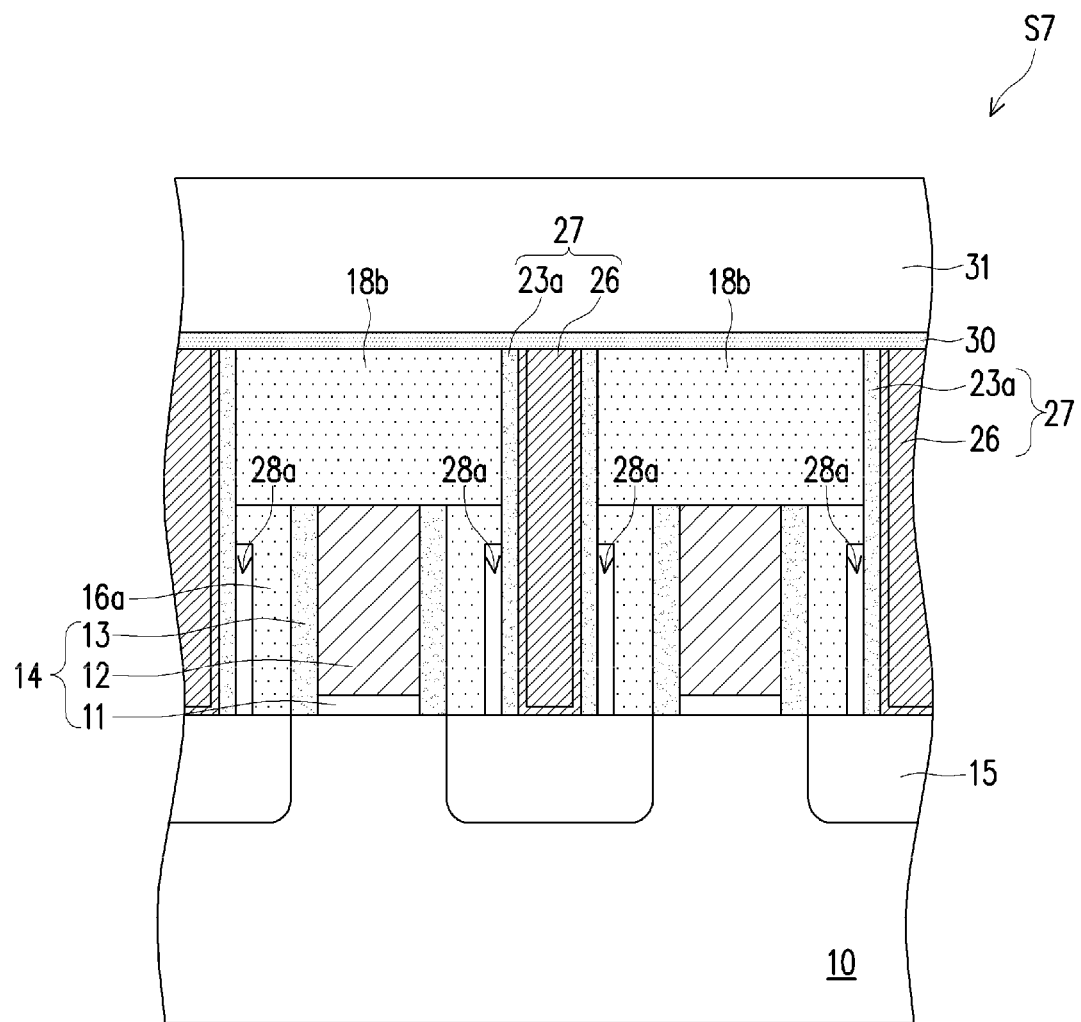

Referring to FIG. 9C and FIG. 10C, after performing the planarization process and forming the etch stop layer 30 and dielectric layer 31, the semiconductor device S7 is formed. In the semiconductor device S7, the air gap 28a is defined by the dielectric layer 16a, the contact structure 27 and the substrate 10. In some embodiments, the lower portion of the dielectric layer 16a is laterally spaced apart from the contact structure 27 by the air gap 28a therebetween, while the upper portion of the dielectric layer 16a and the dielectric layer 18b are in contact with sidewalls of the contact structure 27.

Figure 10D:
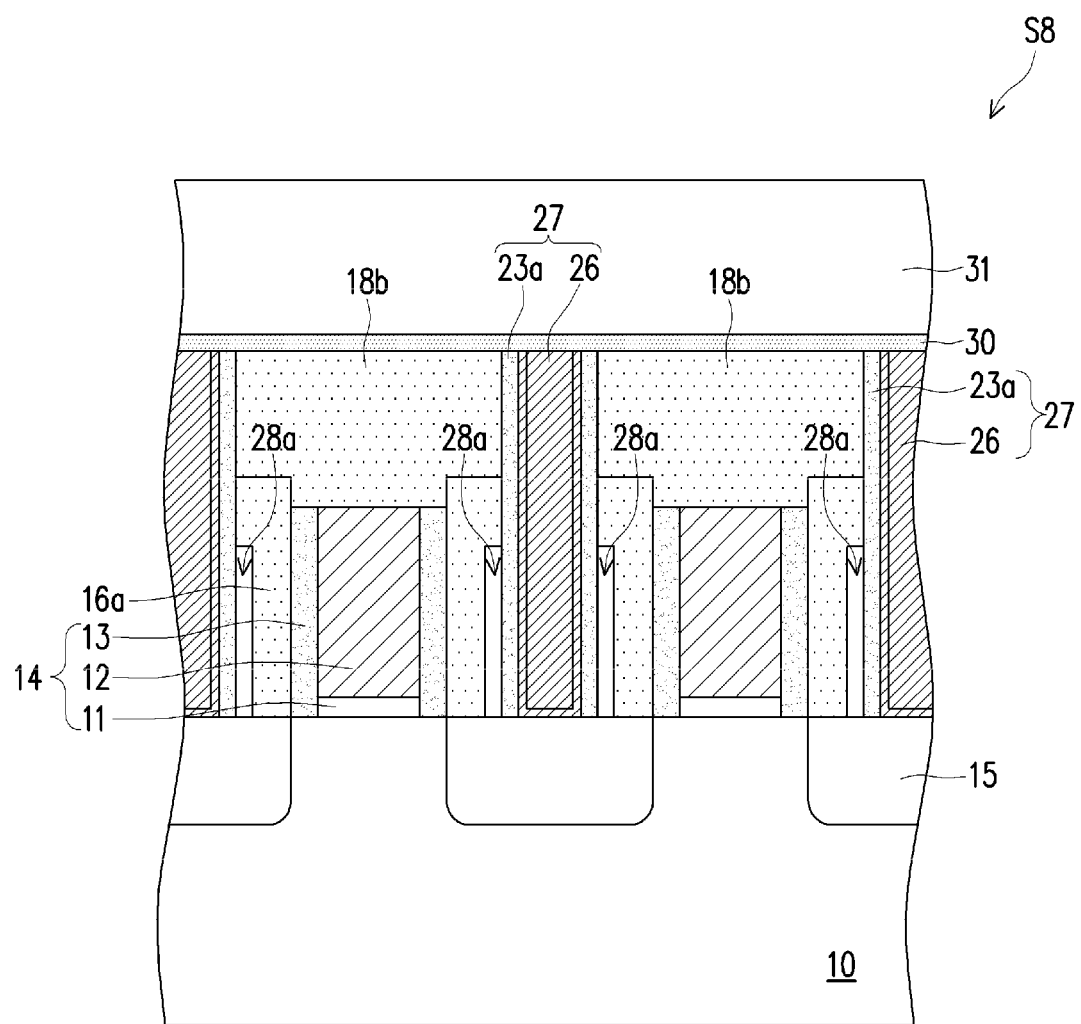

Referring to FIG. 9D and FIG. 10D, after removing the excess portions of the dielectric layer 18a by the planarization process, the dielectric layer 18b has a substantially planar top surface. The air gap 28a is located laterally between the lower portion of the dielectric layer 16a and the contact structure 27, while the upper portion of the dielectric layer 16a and the dielectric layer 18b are in contact with sidewalls of the contact structure 27. In some embodiments, the dielectric layer 16a extends to have a top surface higher than the top surface of the gate structure 14, and the lower portion of the dielectric layer 18b may be laterally surrounded by the dielectric layer 16a.

It is noted that, the above-described structures of semiconductor device having air gap are merely for illustration, and the disclosure is not limited thereto. Depending on the doping energy and dosage of the doping process, the ILDs may have any suitable profiles, as long as the air gap is remained at least laterally between a portion of contact structure and the ILD, and the top of the air gap is sealed by the ILD and/or overlying etch stop layer.

In the embodiments of the disclosure, an air gap is formed laterally between the contact structure and adjacent dielectric features, the air gap may be referred to as a dielectric having very low k value (e.g. 1 or less than 1), therefore, the parasitic capacitance of the semiconductor device may be reduced, thereby increasing the operating speed and performance of the device. On the other hands, in some embodiments, contact spacers are formed on sidewalls of the contact, which may help to avoid or reduce leakage between the contact and the gate electrode. In addition, the air gap is sealed by a sealing material, thereby avoiding air gap refill issue during the formation of via plugs on the contacts and/or gate electrodes.

In accordance with some embodiments of the disclosure, a semiconductor device includes a substrate, a gate structure, a dielectric structure and a contact structure. The substrate has source/drain (S/D) regions. The gate structure is on the substrate and between the S/D regions. The dielectric structure covers the gate structure. The contact structure penetrates through the dielectric structure to connect to the S/D region. A lower portion of a sidewall of the contact structure is spaced apart from the dielectric structure by an air gap therebetween, while an upper portion of the sidewall of the contact structure is in contact with the dielectric structure.

In accordance with alternative embodiments of the disclosure, a semiconductor device includes a substrate having source/drain (S/D) regions, a gate structure, a contact structure, a first dielectric layer and a second dielectric layer. The gate structure is on the substrate and between the S/D regions. The contact structure is laterally aside the gate structure and connected to the S/D region. The first dielectric layer is laterally aside the gate structure and the contact structure, wherein the first dielectric layer is spaced apart from the contact structure by an air gap therebetween. The second dielectric layer is over the first dielectric layer and the gate structure, and laterally aside the contact structure, wherein the second dielectric layer comprises a dopant therein.

In accordance with some embodiments of the disclosure. A method of forming a semiconductor device includes the following processes: forming a gate structure on a substrate; forming a S/D region in the substrate and on sides of the gate structure; forming a dielectric structure comprising a first dielectric layer laterally aside the gate structure and a second dielectric layer over the first dielectric layer and the gate structure; forming a contact structure penetrating through the dielectric structure to connect to the S/D region; forming a sacrificial layer laterally between the dielectric structure and the contact structure; removing the sacrificial layer to form a first air gap laterally between the contact structure and the dielectric structure; and performing a sealing process to seal a top of the first air gap, and remaining a second air gap laterally between lower portions of the contact structure and the dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate comprising source/drain (S/D) regions;
a gate structure on the substrate and between the S/D regions;
a dielectric structure covering the gate structure, the dielectric structure comprising a first dielectric layer and a second dielectric layer stacked over the first dielectric layer, wherein the gate structure is laterally surrounded by the first dielectric layer, and the first dielectric layer is in contact with sidewalls of the gate structure; and
a contact structure penetrating through the dielectric structure to connect to the S/D region, wherein the contact structure is spaced apart from the first dielectric layer of the dielectric structure by an air gap therebetween, and the S/D regions are exposed at a bottom of the air gap.

2. The semiconductor device of claim 1, wherein the dielectric structure further comprises a first etch stop layer disposed between the first dielectric layer and the second dielectric layer.

3. The semiconductor device of claim 2, wherein the first etch stop layer is spaced apart from the contact structure by the air gap.

4. The semiconductor device of claim 1, wherein the second dielectric layer laterally protrudes from a sidewall of the first dielectric layer, and the second dielectric layer are in contact with the contact structure.

5. The semiconductor device of claim 2, wherein the air gap is further disposed laterally between at least a portion of a sidewall of the first etch stop layer and the contact structure.

6. The semiconductor device of claim 1, wherein the dielectric structure further comprises a sealing material, the sealing material is laterally between and in contact with the second dielectric layer and an upper portion of a sidewall of the contact structure.

7. The semiconductor device of claim 6, further comprising a second etch stop layer, the second etch stop layer comprises a body portion and an extending portion, the body portion is on the second dielectric layer and the contact structure, and the extending portion serves as the sealing material.

8. The semiconductor device of claim 7, wherein there is free of interface between the extending portion and the body portion.

9. A semiconductor device, comprising:
a substrate comprising source/drain (S/D) regions;
a gate structure on the substrate and between the S/D regions;
a contact structure laterally aside the gate structure and connected to the S/D region;
a first dielectric layer laterally aside the gate structure and a lower portion of the contact structure, wherein the first dielectric layer is spaced apart from the lower portion of the contact structure by an air gap therebetween, and the S/D regions are exposed at a bottom of the air gap; and
a second dielectric layer disposed over the air gap, the first dielectric layer and the gate structure, the second dielectric layer is in contact with an upper portion of the contact structure.

10. The semiconductor device of claim 9, wherein the contact structure comprises a contact and a contact spacer on sidewalls of the contact, the second dielectric layer is in contact with the contact spacer of the contact structure.

11. The semiconductor device of claim 9, wherein the first dielectric layer is undoped, or comprises a dopant and having a doping concentration less than a doping concentration of the second dielectric layer.

12. The semiconductor device of claim 9, further comprising a second etch stop layer on the second dielectric layer and the contact structure, wherein the second etch stop layer is separated from the air gap by the second dielectric layer therebetween.

13. The semiconductor device of claim 12, wherein the second etch stop layer is free of dopant.

14. The semiconductor device of claim 12, wherein the second etch stop layer comprises a dopant the same as a dopant in the second dielectric layer.

* * * * *